United States Patent
Itoh et al.

(10) Patent No.: US 6,746,876 B2
(45) Date of Patent: Jun. 8, 2004

(54) CAPACITOR MANUFACTURING METHOD HAVING DIELECTRIC FORMED BEFORE ELECTRODE

(75) Inventors: Hiromi Itoh, Tokyo (JP); Yoshikazu Tsunemine, Tokyo (JP); Keiichiro Kashihara, Tokyo (JP); Akie Yutani, Tokyo (JP); Tomonori Okudaira, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/310,765

(22) Filed: Dec. 6, 2002

(65) Prior Publication Data

US 2003/0228733 A1 Dec. 11, 2003

(30) Foreign Application Priority Data

Jun. 5, 2002 (JP) ........................................ 2002-164765

(51) Int. Cl.$^7$ .......................................... H01L 21/8242
(52) U.S. Cl. .............................. 438/3; 438/3; 438/240; 438/253
(58) Field of Search ........................... 438/3, 238–241, 438/250–256, 381, 393–396

(56) References Cited

U.S. PATENT DOCUMENTS 5,854,107 A * 12/1998 Park et al. ................. 438/254
6,384,443 B1   5/2002 Tsunemine
6,500,763 B2 * 12/2002 Kim et al. ................. 438/689
6,544,835 B2 * 4/2003 Yamamoto et al. ......... 438/240

FOREIGN PATENT DOCUMENTS

| JP | 10-154801 | 6/1998 |
| JP | 2000-252441 | 9/2000 |
| JP | 2001-210803 | 8/2001 |

OTHER PUBLICATIONS

H. Itoh, et al., Symposium on VLSI Technology Digest of Technical Papers, pp. 106–107, "A New Cell Technology for the Scalabe BST Capacitor Using Damascene–Formed Pedestal Electrode with a [Pt–Ir] Alloy Coating", 2000.

* cited by examiner

Primary Examiner—Thanh Nguyen
(74) Attorney, Agent, or Firm—Oblon, Spivak, McClelland, Maier & Neustadt, P.C.

(57) ABSTRACT

A method for manufacturing a capacitor is provided which can form a lower electrode having a high aspect ratio without suffering deterioration of the capacitor electric characteristics even when a platinum-group metal is adopted as the material of the lower electrode and a metal oxide having a high dielectric constant is adopted as the material of the dielectric film. Holes (8) that reach contact plugs (2) are formed in an insulating film (7). Then a dielectric film (9) is formed on the surfaces of the holes (8). Next the dielectric film (9) on the bottoms of the holes (8) are etched away to form holes (18) reaching the contact plugs (2). Lower electrodes (11) are then formed to fill the holes (8) and (18).

14 Claims, 17 Drawing Sheets

F I G . 3 1
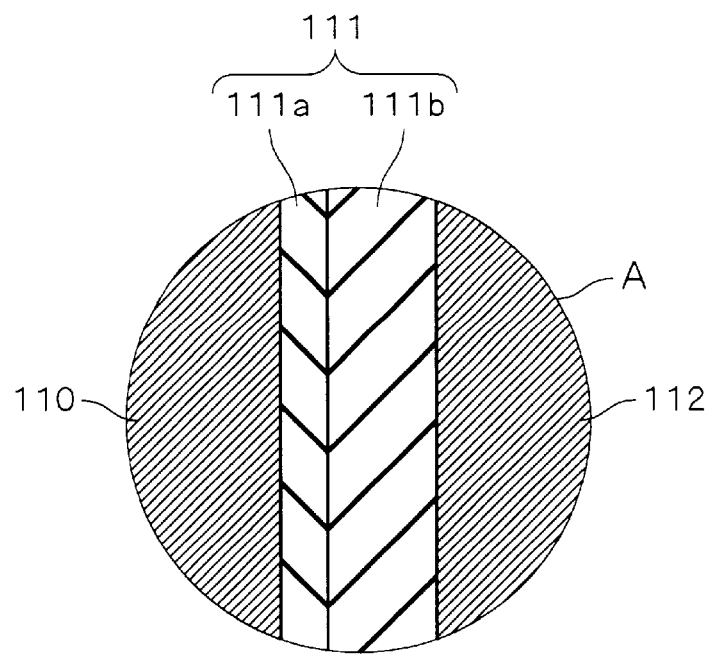
F I G . 3 2
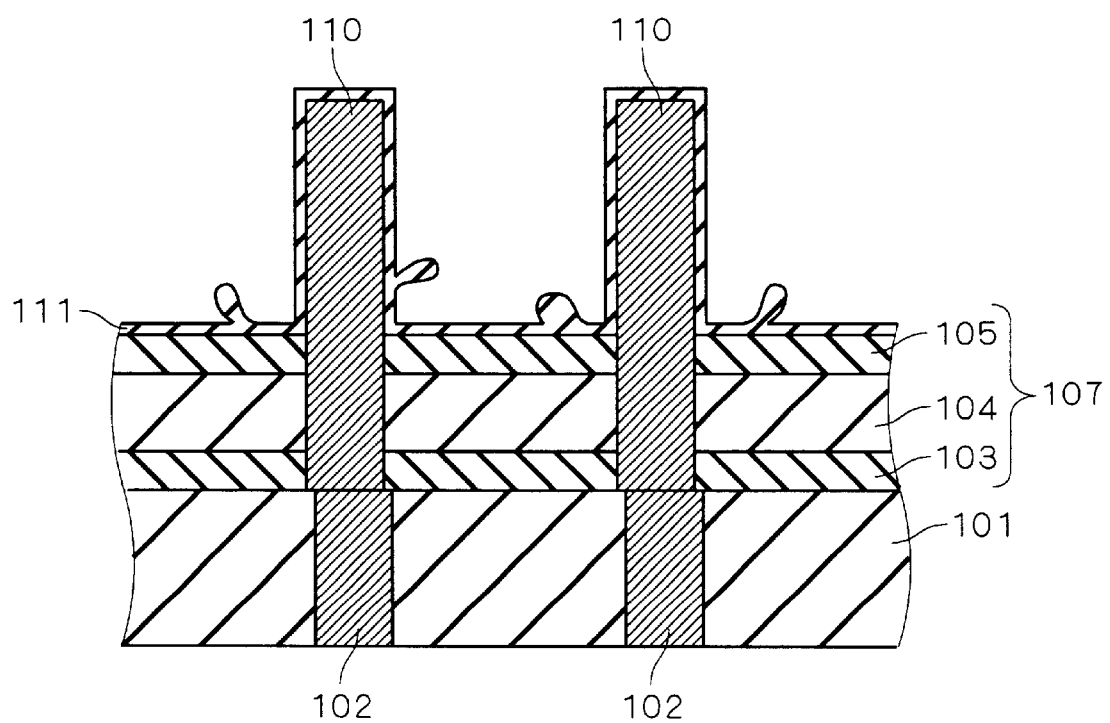

CAPACITOR MANUFACTURING METHOD HAVING DIELECTRIC FORMED BEFORE ELECTRODE

BACKGROUND OF THE INVENTION

1. Field of the Invention

The present invention relates to a method of manufacturing a capacitor having a pillar-like lower electrode.

2. Description of the Background Art

Increasing the degree of integration of semiconductor devices containing DRAMs (Dynamic Random Access Memories), or DRAMs and logic devices in combination, reduces the capacitor area for DRAMs, leading to a reduction in the capacitance of capacitors. In order to compensate for the reduction of capacitance, the dielectric material conventionally used as the capacitor dielectric films, i.e. the stacked structure of silicon oxide film (SiO) and silicon nitride film (SiN), is now being rapidly displaced by metal oxide dielectrics having larger relative permittivity, such as dielectrics with perovskite structure or tantalum oxide.

In this case, the lower electrodes of capacitors are exposed to a high-temperature oxidizing atmosphere during formation of the dielectric film. When the lower electrodes are oxidized by this, an oxide having a lower relative permittivity than the dielectric film is formed at the interface between the lower electrodes and the dielectric film. This greatly reduces the advantage of use of the high-dielectric-constant material as the dielectric film.

Accordingly, usually, noble metals of the platinum group such as Pt (platinum), Ru (ruthenium) and Ir (iridium), which are hereinafter referred to as platinum-group metals, are adopted as the material of the lower electrodes; the platinum-group metals are less susceptible to oxidation even when exposed to high-temperature oxidizing atmosphere, or they form conductive oxides even if oxidized. This avoids the formation of adversely affecting oxides of low dielectric constants at the interface between the lower electrodes and the dielectric film.

FIGS. 26 to 30 are cross-sectional views sequentially showing a capacitor manufacturing method according to a first conventional technique, where a metal oxide having a high dielectric constant is used as the material of the dielectric film and a platinum-group metal is used as the material of the lower electrodes. Now, referring to FIGS. 26 to 30, the first conventional capacitor manufacturing method is described.

As shown in FIG. 26, an interlayer insulating film 101 is provided which has contact plugs 102 formed therein. The top surfaces of the contact plugs 102 are exposed from the interlayer insulating film 101. Then an insulating film 107 is formed on the interlayer insulating film 101 and the contact plugs 102. The insulating film 107 includes a stopper film 103, an interlayer insulating film 104, a stopper film 105, and an interlayer insulating film 106, which are stacked in the order named. The insulating film 107 is formed so that the stopper film 103 is located on the side of the interlayer insulating film 101.

Next, the insulating film 107 is etched from the top surface to form holes 108 in the insulating film 107; the holes 108 reach the contact plugs 102. Though not shown, a semiconductor substrate having semiconductor elements connected to the contact plugs 102 resides under the interlayer insulating film 101 (i.e. on the side opposite to the insulating film 107).

Next, as shown in FIG. 27, by CVD (Chemical Vapor Deposition) method or plating method, an electrode material 109 of the lower electrodes is formed to fill the holes 108 and also formed on the top surface of the insulating film 107. The electrode material 109 is Ru, for example.

Then, as shown in FIG. 28, the structure obtained by the process of FIG. 27 is polished from the top surface thereof by, e.g. CMP (Chemical Mechanical Polishing) method, so as to remove the part of the electrode material 109 that is located above the holes 108. In this manner, lower electrodes 110 of Ru are formed filling the holes 108. Then, as shown in FIG. 29, part of the insulating film 107, more specifically the interlayer insulating film 106, is selectively removed by, e.g. wet etching. During this process, the stopper film 105 serves as an etching stopper.

Next, as shown in FIG. 30, a dielectric film 111 of, e.g. BST (barium strontium titanate: $Ba_xSr_{(1-x)}TiO_3$) having perovskite structure, is formed by CVD method on the lower electrodes 110 and the insulating film 107. Then an upper electrode 112 of, e.g. Ru, is formed on the dielectric film 111 to complete the capacitors.

As shown above, a metal oxide having a high dielectric constant is adopted as the material of the dielectric film 111 and a platinum-group metal is adopted as the material of the lower electrodes 110, and then it is possible to compensate for the reduction of capacitance that is caused as the semiconductor devices, like DRAMs, are more highly integrated. Capacitors that use a metal material as the upper and lower electrodes are called MIM capacitors.

In the first conventional capacitor manufacturing method, during the formation of the dielectric film 111 on the lower electrodes 110, the catalysis of the platinum-group metal, adopted as the material of the lower electrodes 110, may cause abnormalities in composition and shape of the dielectric film 111, which may degrade the electric characteristics of the capacitors.

Generally, the platinum-group metals produce strong catalysis on the surface in an oxidizing organic chemical reaction system. Now, the CVD method for forming the dielectric film 111 of a metal oxide having a high dielectric constant, like BST, is usually MOCVD (Metal Organic CVD) method that uses organic metal material gas and causes oxidation reaction; the platinum-group metal therefore exerts strong catalysis on the surface of the lower electrodes 110 during the formation of the dielectric film 111 on the lower electrodes 110. This strong catalysis may cause abnormalities in the composition and shape of the dielectric film 111.

FIG. 31 shows a condition in which the catalysis of the platinum-group metal changes the composition of the dielectric film 111 near the surface of the lower electrode 110; FIG. 31 shows the part A of FIG. 30 in an enlarged manner. The dielectric film 111a shown in FIG. 31 is formed during the early stages of the process of forming the dielectric film 111; the composition of the dielectric film 111a is made abnormal by the catalysis produced on the surface of the lower electrode 110. On the other hand, as the process of forming the dielectric film 111 advances, the dielectric film 111b shown in FIG. 31 is formed after the lower electrode 110 has been coated by the dielectric film 111a. Therefore it is not affected by the catalysis caused on the surface of the lower electrode 110 and therefore has a normal composition.

As shown above, the composition of the dielectric film 111a near the surface of the lower electrode 110 often considerably differs from that of the dielectric film 111b formed later and having normal composition. For example, when BST is used as the material of the dielectric film 111, the dielectric films 111a and 111b may exhibit considerably different composition ratios from each between the metallic elements of BST, more specifically between Ba or Sr and Ti.

Also, as shown in FIG. 32, the catalysis caused on the surface of the lower electrodes 110 may form abnormal projections in part of the dielectric film 111. FIG. 32 shows the capacitor structure where the upper electrode 112 is not formed yet.

In order to avoid these problems, a second conventional technique is suggested in which, in the formation of the dielectric film, part of the dielectric film is formed on the lower electrodes 110 by PVD (Physical Vapor Deposition) method and then the remaining part of the dielectric film is formed by CVD method on the dielectric film formed by PVD method.

FIG. 33 is a cross-sectional view showing a capacitor structure manufactured by the second conventional manufacturing method; FIG. 33 shows the capacitor structure where the upper electrode is not formed yet. As shown in FIG. 33, a dielectric film 120 including dielectric films 120a and 120b is formed on the lower electrodes 110; the dielectric film 120a is formed by PVD method on the lower electrodes 110 and then the dielectric film 120b is formed by CVD method on the dielectric film 120a formed by PVD method.

Unlike the CVD method, the PVD method is a physical film formation method that involves almost no chemical reaction, and therefore forming the dielectric film 120a by PVD method on the lower electrodes 110 can prevent occurrence of catalysis of the lower electrodes 110. Even when the dielectric film 120b formed by CVD method is made of the same kind of material as the dielectric film 120a, the catalysis of the lower electrodes 110 is not caused since the surfaces of the lower electrodes 110 are covered by the dielectric film 120a. Thus the dielectric film 120 suffers no abnormality in the composition and shape and hence no deterioration of capacitor electric characteristics.

However, because PVD method has poorer step coverage than CVD method, the second conventional method using PVD method may form the dielectric film 120a with insufficient thickness, as shown in the part B in FIG. 33. Therefore the second conventional method encounters difficulty in forming lower electrodes 110 having a high aspect ratio.

SUMMARY OF THE INVENTION

An object of the present invention is to provide a method for manufacturing a capacitor which can form a lower electrode having a high aspect ratio without suffering deterioration of the capacitor electric characteristics even when a platinum-group metal is adopted as the material of the lower electrode and a metal oxide having a high dielectric constant is adopted as the material of the dielectric film.

The present invention is directed to a capacitor manufacturing method including the steps (a) to (i). The step (a) is to provide an object to be connected. The step (b) is to form an insulating film on the object to be connected. The step (c) is to form a first hole in the insulating film. The step (d) is to form a first dielectric film on the surface of the first hole, without filling the first hole. The step (e) is to form a part of a lower electrode on the first dielectric film, without filling the first hole. The step (f) is to etch the structure obtained by the step (e) from above the surface of the part of the lower electrode that is formed on the bottom of the first hole, so as to form a second hole reaching the object to be connected in the structure obtained by the step (e). The step (g) is to form the remaining part of the lower electrode to fill the first and second holes. The step (h) to remove the insulating film after the step (g). The step (i) it to form an upper electrode on the first dielectric film after the step (h).

Since the first dielectric film is formed prior to the formation of the lower electrode, the lower electrode exert no catalysis even when a platinum-group metal is adopted as the material of the lower electrode and a metal oxide having a high dielectric constant is adopted as the material of the first dielectric film. As a result the capacitor can be manufactured without suffering deterioration of the electric characteristics.

Furthermore, since the first dielectric film is formed prior to the formation of the lower electrode, the first dielectric film can be formed by CVD method. Accordingly, as compared with ones formed by PVD method, the first dielectric film can be formed to a sufficient thickness on the surface of a hole having a high aspect ratio. This method can therefore be applied to the formation of lower electrodes having a high aspect ratio.

Moreover, during the formation of the second hole in the step (f), the structure is etched from above the surface of the part of the lower electrode, so that the first dielectric film is not damaged by the etching. Therefore the electric characteristics of the first dielectric film are not deteriorated in the step (f). This enhances the electric characteristics of the capacitor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a cross-sectional view showing in an enlarged manner the capacitor structure of the first conventional technique;

FIG. 32 is a cross-sectional view showing the capacitor structure of the first conventional technique.

DESCRIPTION OF THE PREFERRED EMBODIMENTS

First Preferred Embodiment

FIGS. 1 to 9 are cross-sectional views sequentially showing a capacitor manufacturing method according to a first preferred embodiment of the invention, where a platinum-group metal is adopted as the material of the lower electrodes and a metal oxide having a high dielectric constant is adopted as the material of the dielectric film. The capacitor manufacturing method of the first preferred embodiment is now described referring to FIGS. 1 to 9.

Figure 1:
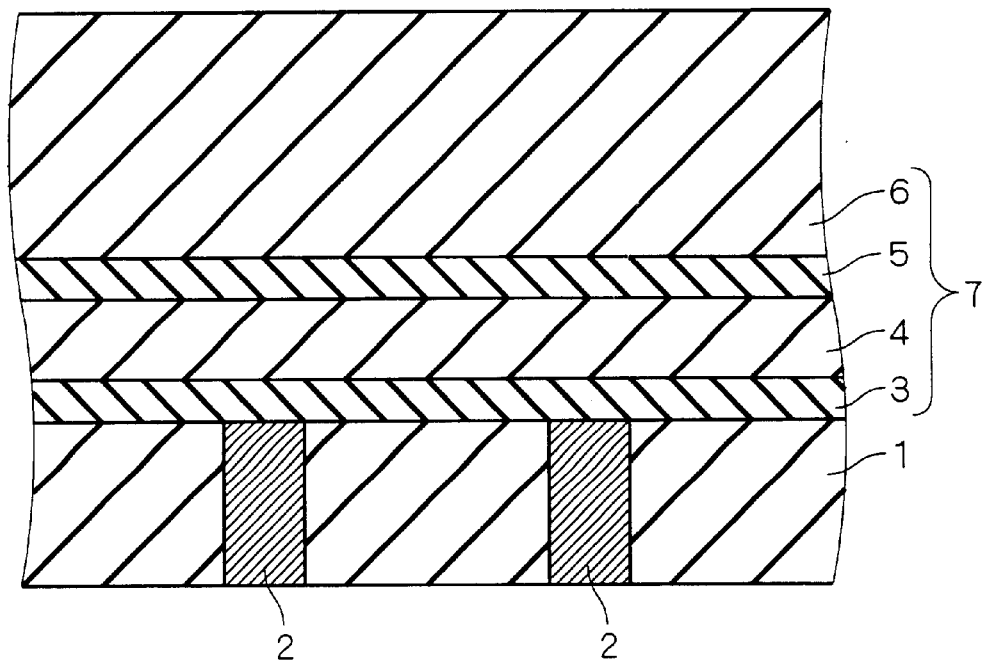
FIGS. 1 to 9 are cross-sectional views sequentially showing a capacitor manufacturing method according to a first preferred embodiment of the present invention.

As shown in FIG. 1, an interlayer insulating film 1 is provided which has contact plugs 2 formed therein. The contact plugs 2, which are objects to be electrically connected to the lower electrodes of the capacitors, have their top surfaces exposed in the top surface of the interlayer insulating film 1. The top surface of the interlayer insulating film 1 and the top surfaces of the contact plugs 2 are located on the same plane.

Next, an insulating film 7 is formed on the interlayer insulating film 1 and the contact plugs 2. The insulating film 7 has a stopper film 3, an interlayer insulating film 4, a stopper film 5, and an interlayer insulating film 6, which are stacked in the order named. The insulating film 7 is formed so that the stopper film 3 is located on the side of the interlayer insulating film 1.

A film of BPSG (boro-phospho silicate glass) is adopted as the interlayer insulating films 1, 4 and 6, and a film of silicon nitride is adopted as the stopper films 3 and 5, for example. The contact plugs 2 are made of polysilicon, for example. Though not shown in the drawing, a semiconductor substrate having semiconductor elements connected to the contact plugs 2 resides under the interlayer insulating film 1 (i.e. on the side opposite to the insulating film 7).

Figure 2:
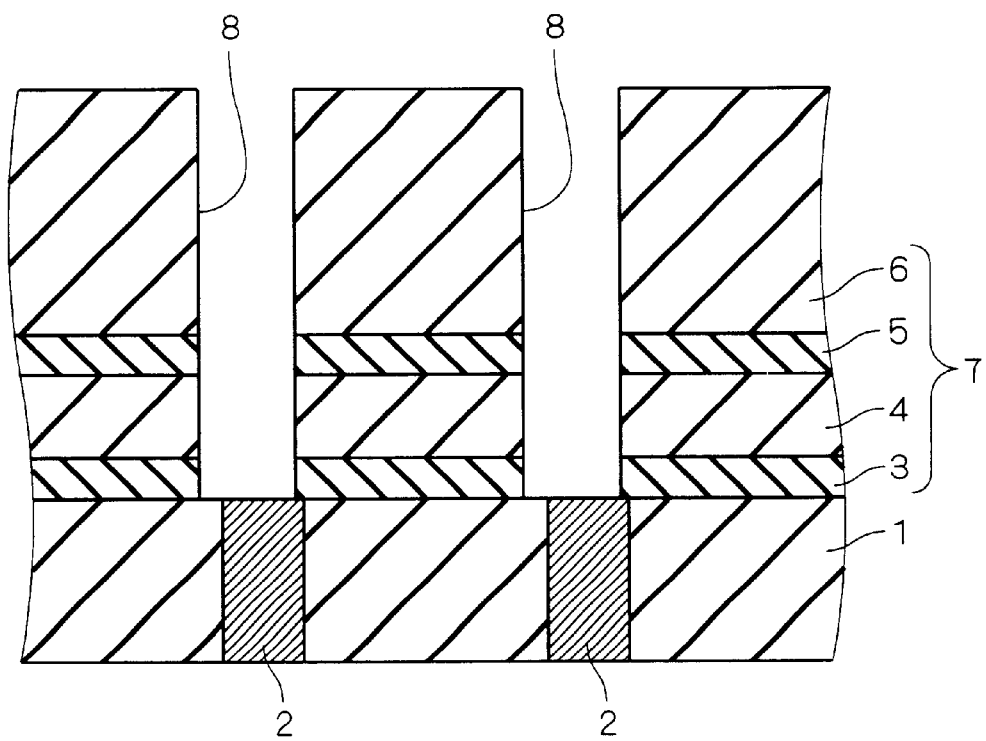

Next, as shown in FIG. 2, the insulating film 7 is etched down from the top surface thereof to form holes 8 reaching the contact plugs 2 in the insulating film 7. More specifically, first, a photoresist having a given opening pattern is formed on the interlayer insulating film 6. Then the interlayer insulating film 6 is etched using the photoresist as a mask and using the stopper film 5 as an etching stopper, thereby forming holes reaching the stopper film 5 in the interlayer insulating film 6. The exposed stopper film 5 is then removed to expose the interlayer insulating film 4. Further, the interlayer insulating film 4 is etched using the stopper film 3 as an etching stopper to form holes reaching the stopper film 3 in the interlayer insulating film 4. The exposed stopper film 3 is then removed to expose the contact plugs 2. The holes 8 opening to the top surface of the insulating film 7 and reaching the contact plugs 2 are thus formed in the insulating film 7.

Figure 3:
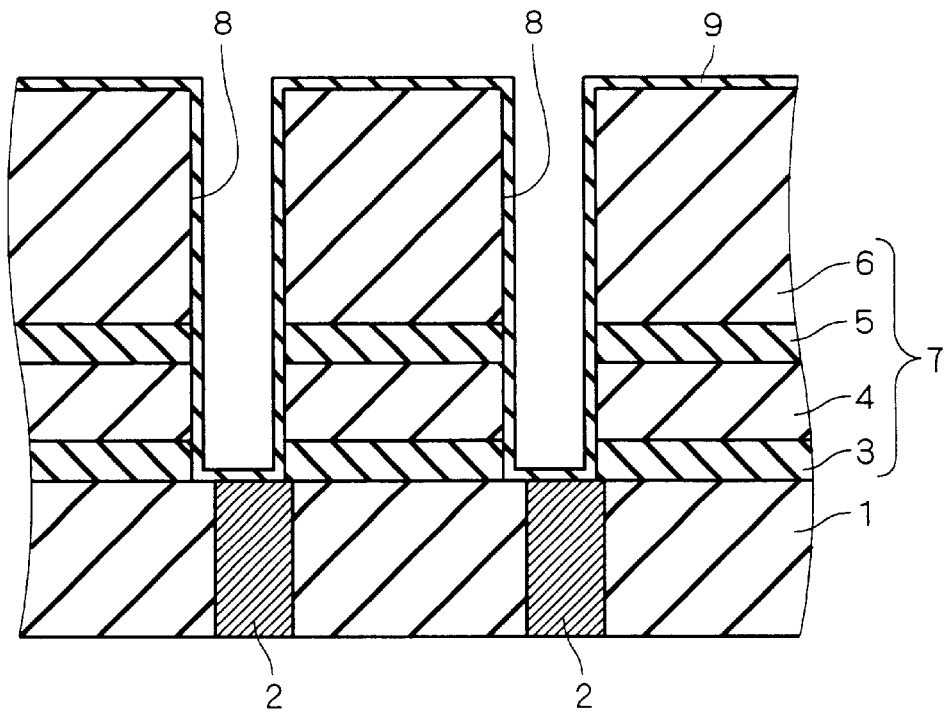

Next, as shown in FIG. 3, a dielectric film 9 is formed by CVD method on the top surface of the insulating film 7 and on the surfaces of the holes 8, without filling the holes 8. Thus the dielectric film 9 is formed on the exposed surface of the insulating film 7 and the exposed top surfaces of the interlayer insulating film 1 and the contact plugs 2. A metal oxide having a high dielectric constant, e.g., BST, tantalum oxide, or PZT (lead zirconate titanate: $Pb(Zr_xTi_{(1-x)})O_3$), is adopted as the material of the dielectric film 9.

Figure 4:
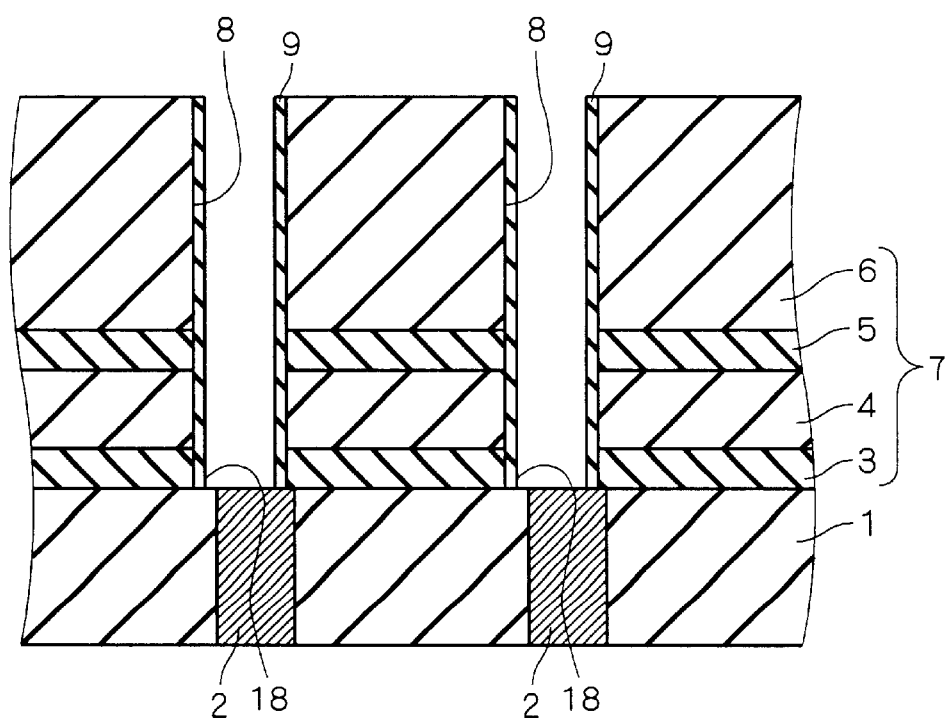

Next, as shown in FIG. 4, an anisotropic dry etching exhibiting a high etching rate in the direction of the thickness of the insulating film 7 is applied to the entire surface of the structure obtained by the process of FIG. 3. Thus the structure obtained by the step of FIG. 3 is etched down from the surfaces of the dielectric film 9 formed on the bottoms of the holes 8, so that the dielectric film 9 is removed from the top surface of the interlayer insulating film 1 and from the top surfaces of the contact plugs 2. As a result, holes 18 reaching the contact plugs 2 are formed in the structure obtained by the process of FIG. 3. The structure obtained by the process of FIG. 3 is also etched down from the top surface of the dielectric film 9 formed on the top surface of the interlayer insulating film 6 and the dielectric film 9 is removed also from the top surface of the interlayer insulating film 6.

Figure 5:
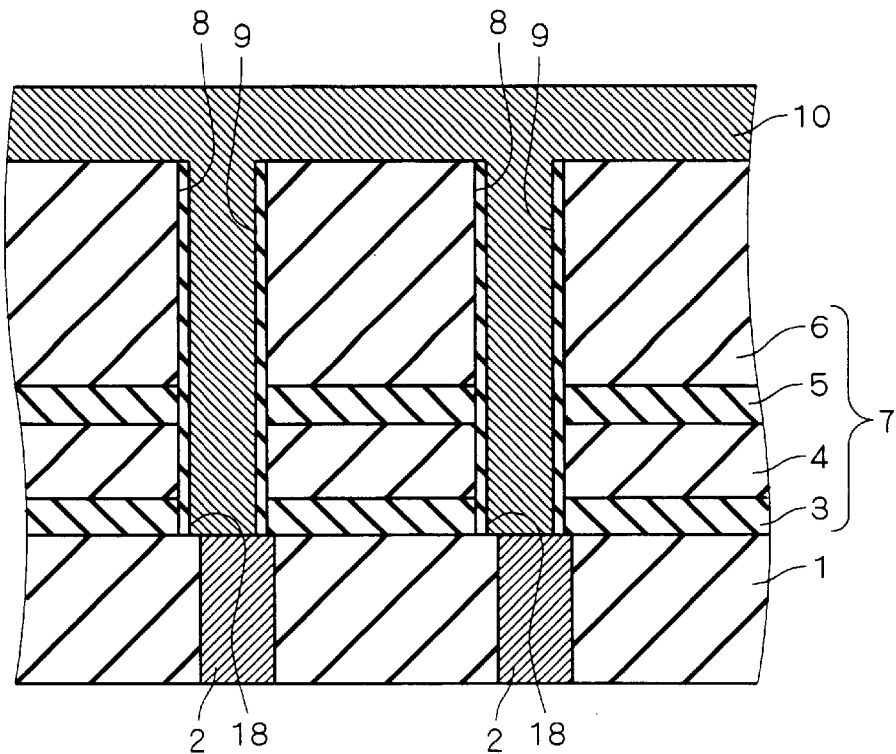

Next, as shown in FIG. 5, the electrode material 10 of the lower electrodes is applied by CVD method or plating method to fill the holes 8 and also formed on the top surface of the insulating film 7. The electrode material 10 is formed of a platinum-group metal, such as Ru.

Figure 6:
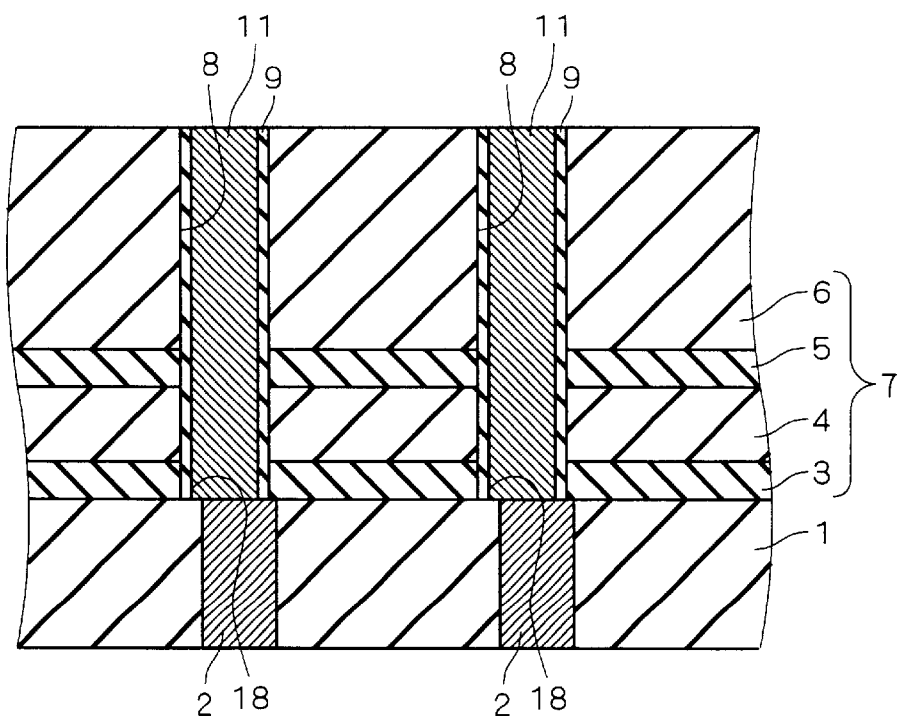

Then, as shown in FIG. 6, the structure obtained by the process of FIG. 5 is polished down from the top surface by, e.g. CMP, so as to remove the electrode material 10 located above the holes 8. Pillar-like lower electrodes 11 made of a platinum-group metal and filling the holes 8 and 18 are formed in this manner. The lower electrodes 11 are electrically connected to the contact plugs 2 and are exposed from the insulating film 7 only in the top surfaces.

Figure 7:
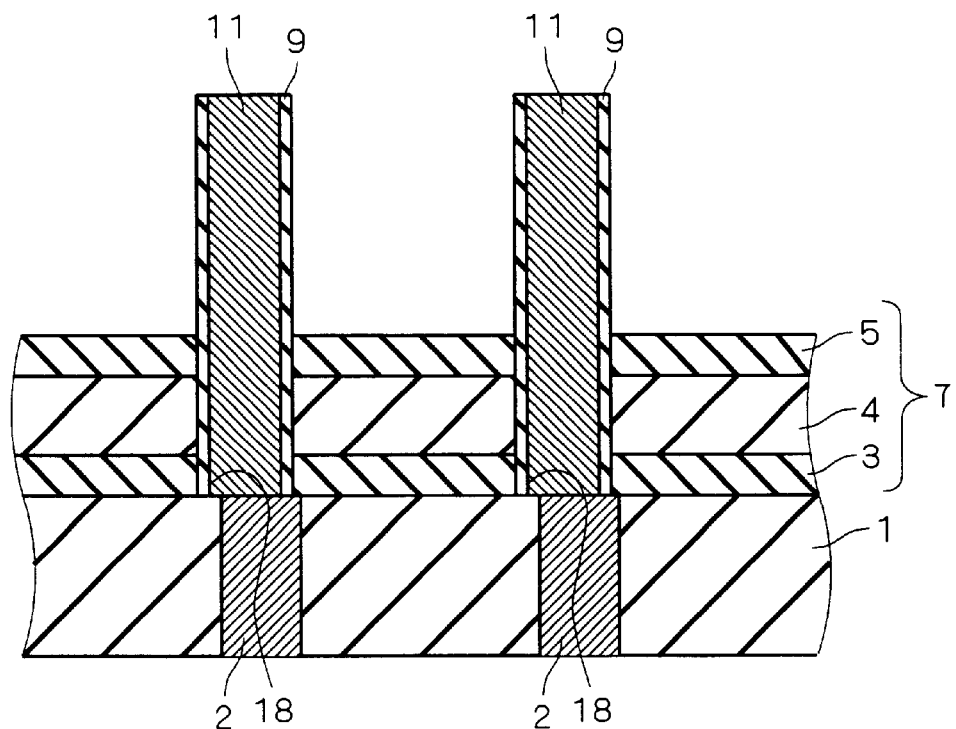

Next, as shown in FIG. 7, a wet or dry etching is applied to the structure obtained by the process of FIG. 6 to selectively remove the insulating film 7, more specifically to remove the interlayer insulating film 6. The stopper film 5 serves as an etching stopper during this process.

Figure 8:
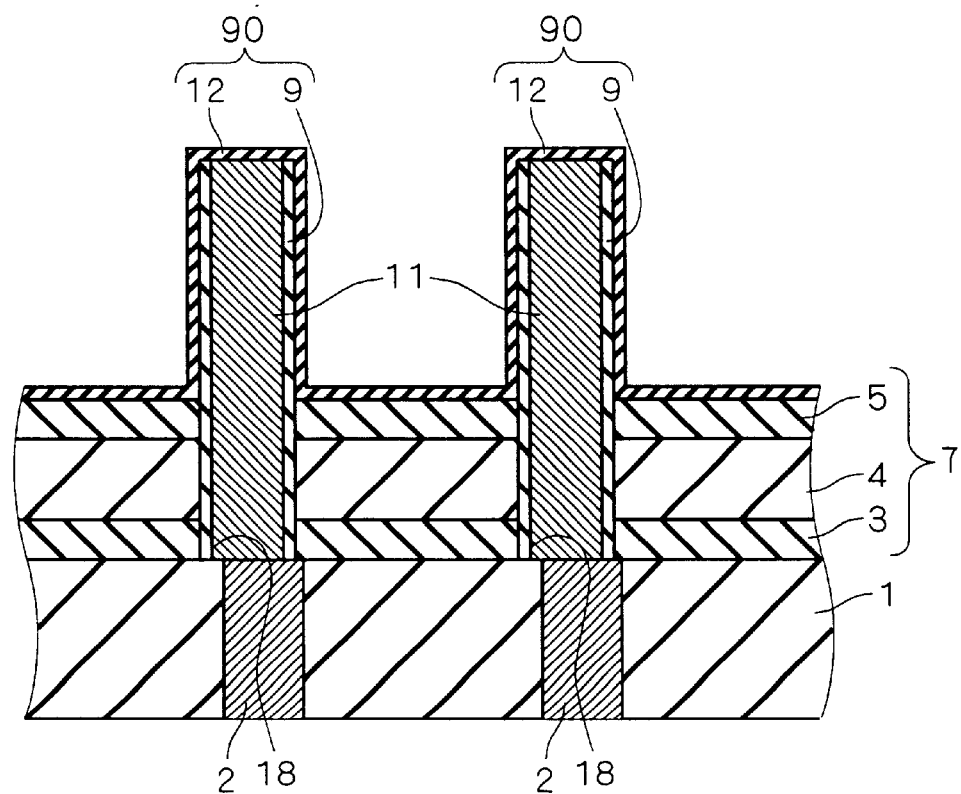

Next, a dielectric film 12 of the same material as the dielectric film 9 is formed by, e.g. PVD method, on the entire surface of the structure obtained by the process of FIG. 7. Thus, as shown in FIG. 8, the dielectric film 12 is formed on the tops of the lower electrodes 11, on the surface of the dielectric film 9, and on the top surface of the stopper film 5; the dielectric film 9 and the dielectric film 12 thus form a capacitor dielectric film 90.

Figure 9:
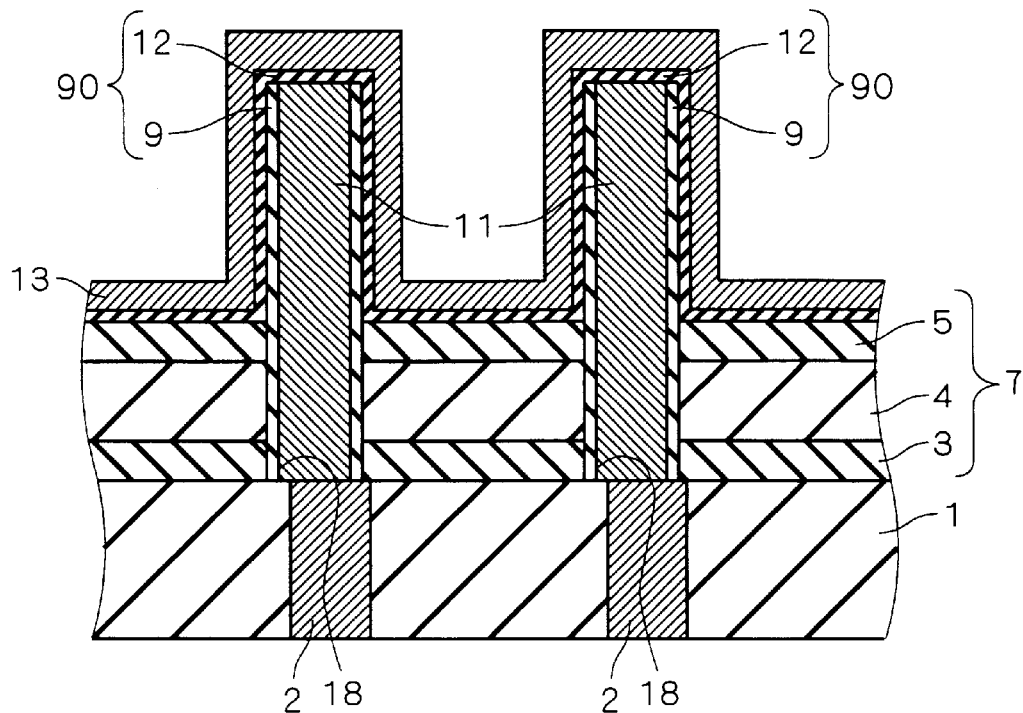

Then, as shown in FIG. 9, an upper electrode 13 of a platinum-group metal, e.g. Ru, is formed on the dielectric film 90 to complete the capacitors.

As described above, according to the capacitor manufacturing method of the first preferred embodiment, the dielectric film 9 is formed prior to the formation of the lower electrodes 11 of a platinum-group metal. Therefore the lower electrodes 11 do not effect the catalysis even when the dielectric film 9 is formed by MOCVD method, although the MOCVD method, generally used to form a film of high-dielectric-constant metal oxide like BST, involves oxidizing organic chemical reaction. That is to say, unlike in the first conventional technique described earlier, the lower electrodes 11 do not produce catalysis even though the lower electrodes 11 are made of a platinum-group metal and the dielectric film 9 is made of a metal oxide with a high dielectric constant as shown in the first preferred embodiment. As a result the capacitors can be manufactured without suffering deterioration of the electric characteristics. In other words, the capacitors manufactured by the method of the first preferred embodiment exhibit enhanced electric characteristics as compared with capacitors manufactured by the first conventional capacitor manufacturing method. The interlayer insulating films 4, 6 and stopper films 3, 5 of the insulating film 7, the interlayer insulating film 1, and the contact plugs 2 are generally made of materials which are catalytically inert to CVD method, so that the insulating film 7, interlayer insulating film 1 and contact plugs 2 do not produce catalysis during the formation of the dielectric film 9.

Furthermore, since the dielectric film 9 is formed before the formation of the lower electrodes 11, the dielectric film 9 can be formed by CVD method as shown in the first preferred embodiment. Accordingly, as compared with ones formed by PVD method, the dielectric film 9 can be formed to a sufficient thickness on the sides of the holes 8 having a higher aspect ratio. Thus, unlike the second conventional technique, this method can be applied to the formation of lower electrodes 11 having a higher aspect ratio.

Moreover, in the formation of the lower electrodes 11 in the capacitor manufacturing method of the first preferred embodiment, the structure obtained by the process of FIG. 5 is polished from the top surface in order to remove the electrode material 10 above the holes 8. Therefore, at first, the lower electrodes 11 are uncovered with the dielectric film 9 only on the top surfaces. Therefore, after the formation of the dielectric film 9, the remaining part of the capacitor dielectric film 90, i.e. the dielectric film 12, can be formed just to sufficiently cover the top surfaces of the lower electrodes 11 as shown in the first preferred embodiment. Accordingly, even when the lower electrodes 11 formed in the holes 8 have a high aspect ratio, the remaining part of the dielectric film can be formed on the lower electrodes 11 by PVD method exhibiting poor step coverage, as shown in the first preferred embodiment. As a result, the dielectric film 12 can be formed without causing the lower electrodes 11 to produce the catalysis.

Figure 10:
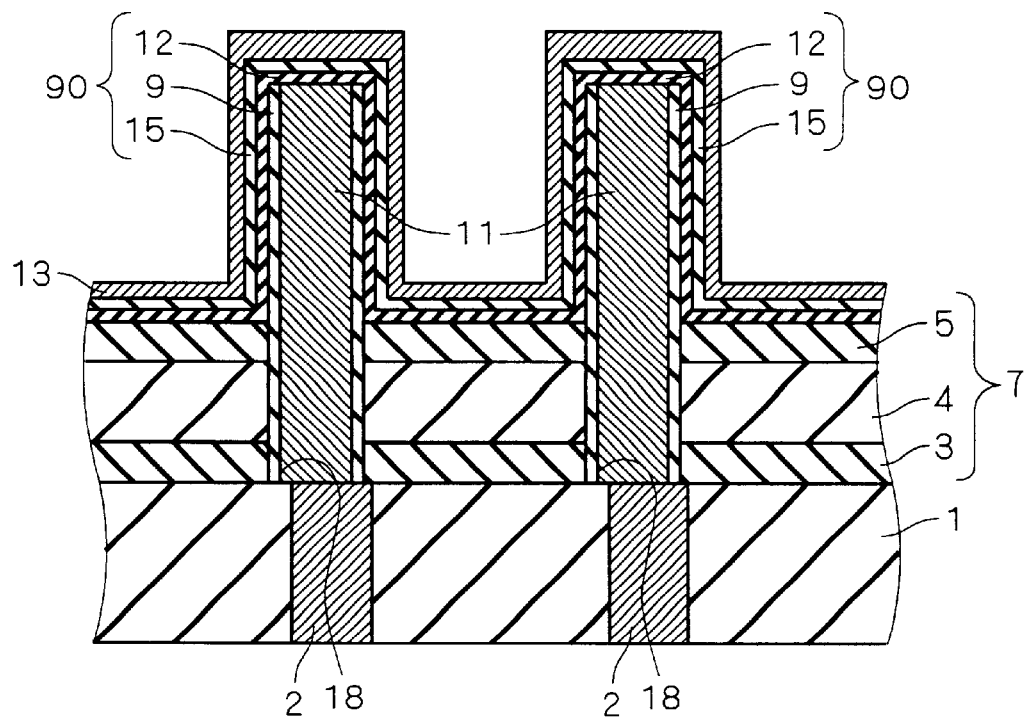
FIG. 10 is a cross-sectional view of a capacitor structure of the first preferred embodiment of the invention.

While the capacitor dielectric film 90 formed by the method of the first preferred embodiment includes the dielectric film 9 and the dielectric film 12, another dielectric film may be formed on the dielectric film 12. FIG. 10 is a cross-sectional view of a capacitor structure in which a dielectric film 15 is further formed on the dielectric film 12. A method for manufacturing the structure of FIG. 10 is now described.

The interlayer insulating film 6, part of the insulating film 7, is removed (see FIG. 7) and then the dielectric film 12 is formed (see FIG. 8), and then the dielectric film 15 is formed by CVD method on the dielectric film 12. The dielectric film 15 is made of the same material as the dielectric films 9 and 12. Then the upper electrode 13 is formed on the dielectric film 15. In this manner, the capacitors having a dielectric film 90, including the dielectric films 9, 12 and 15, are completed as shown in FIG. 10.

Also, in the capacitor manufacturing method of the first preferred embodiment, the holes 8 are formed to reach the contact plugs 2 in the process shown in FIG. 2. However, the holes 8 may be formed to reach at least the top surface of the stopper film 5 in the insulating film 7. As an example, a capacitor manufacturing method is now described in which, in the step of FIG. 2, the holes 8 are formed to reach the top surface of the stopper film 5, and further to reach the top surface of the stopper film 3 past the stopper film 5.

Figure 11:
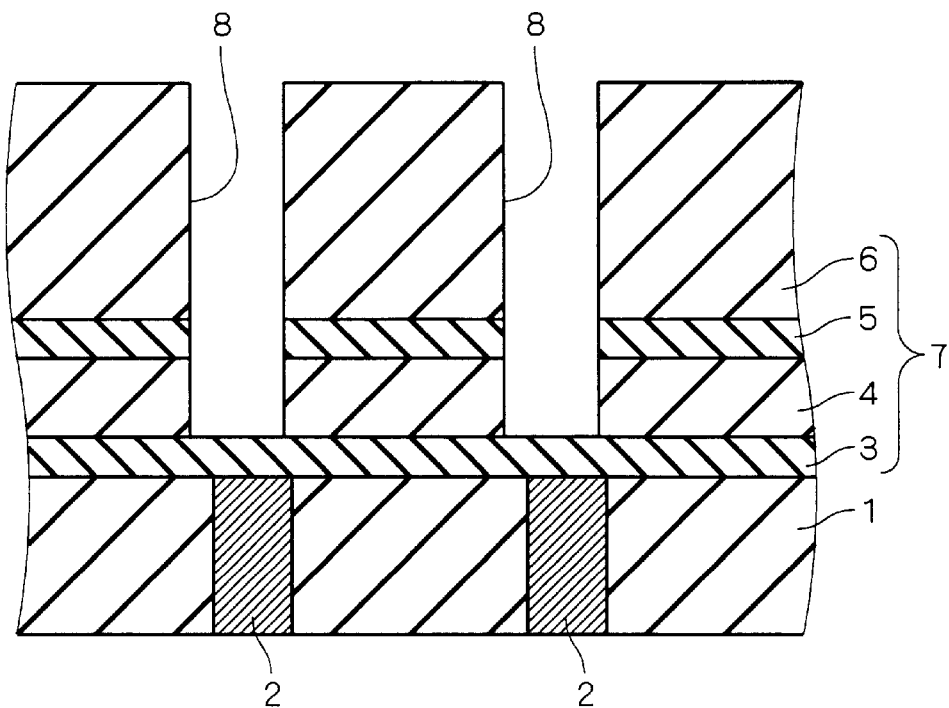
FIGS. 11 to 14 are cross-sectional views sequentially showing a capacitor manufacturing method according to the first preferred embodiment of the invention.

As shown in FIG. 11, the insulating film 7 is etched from the top surface to form the holes 8 reaching the top surface of the stopper film 3 in the insulating film 7. More specifically, the interlayer insulating film 6 is etched using the stopper film 5 as an etching stopper. Next, the stopper film 5, which has been exposed by the etching to the interlayer insulating film 6, is removed, to expose the interlayer insulating film 4. Then, the interlayer insulating film 4 is etched using the stopper film 3 as an etching stopper. Thus holes 8 reaching the top surface of the stopper film 3 are formed in the insulating film 7.

Figure 12:
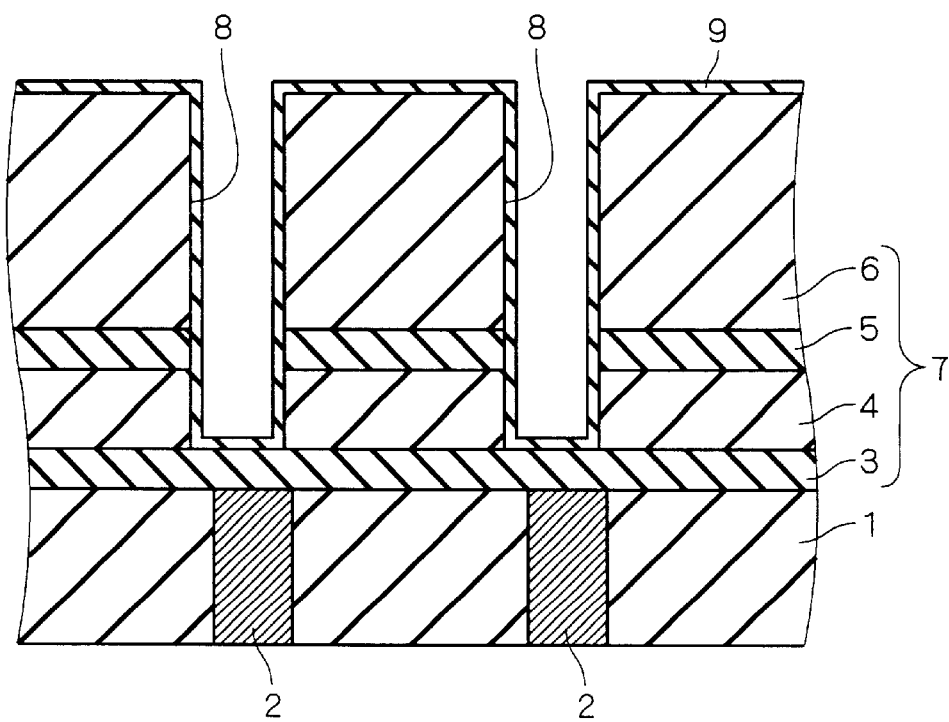

Next, as shown in FIG. 12, the dielectric film 9 is formed by CVD method on the top surface of the interlayer insulating film 6 and on the surfaces of the holes 8, without filling the holes 8. Thus the dielectric film 9 is formed on the exposed surface of the insulating film 7.

Figure 13:
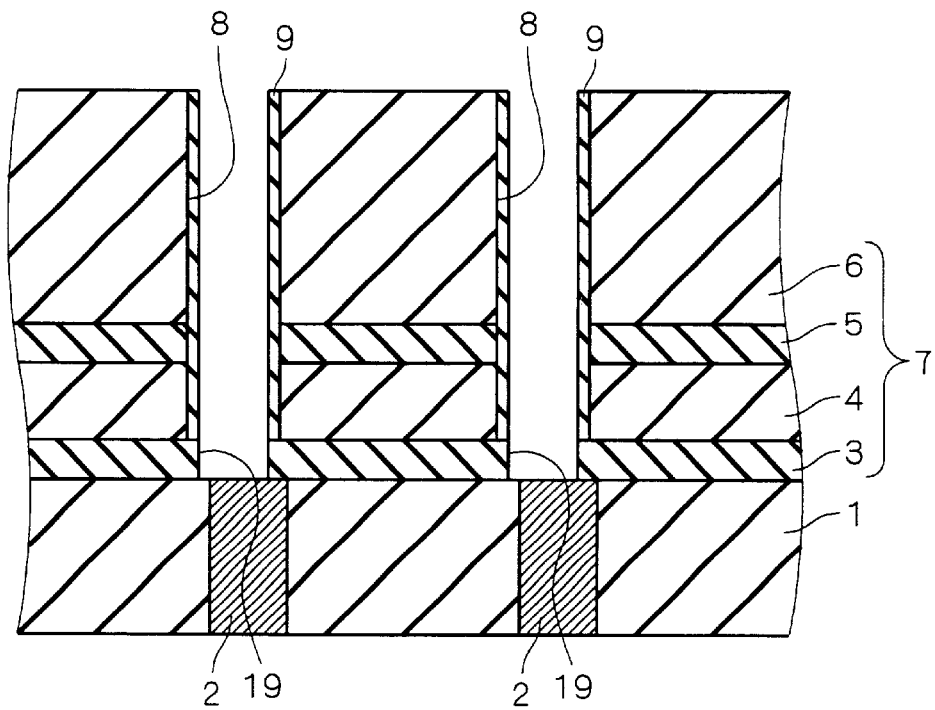

Then, as shown in FIG. 13, an anisotropic dry etching exhibiting a high etching rate in the direction of the thickness of the insulating film 7 is applied to the entire surface of the structure obtained by the process of FIG. 12. Thus, the structure obtained by the step of FIG. 12 is etched from the top of the dielectric film 9 formed on the bottoms of the holes 8, and the dielectric film 9 on the stopper film 3 and the stopper film 3 itself are thus removed. As a result, holes 19 reach the contact plugs 2 in the structure obtained by the process of FIG. 12. The structure obtained by the process of FIG. 12 is etched also from the top of the dielectric film 9 formed on the top surface of the interlayer insulating film 6 and the dielectric film 9 is removed also from the top surface of the interlayer insulating film 6.

Figure 14:
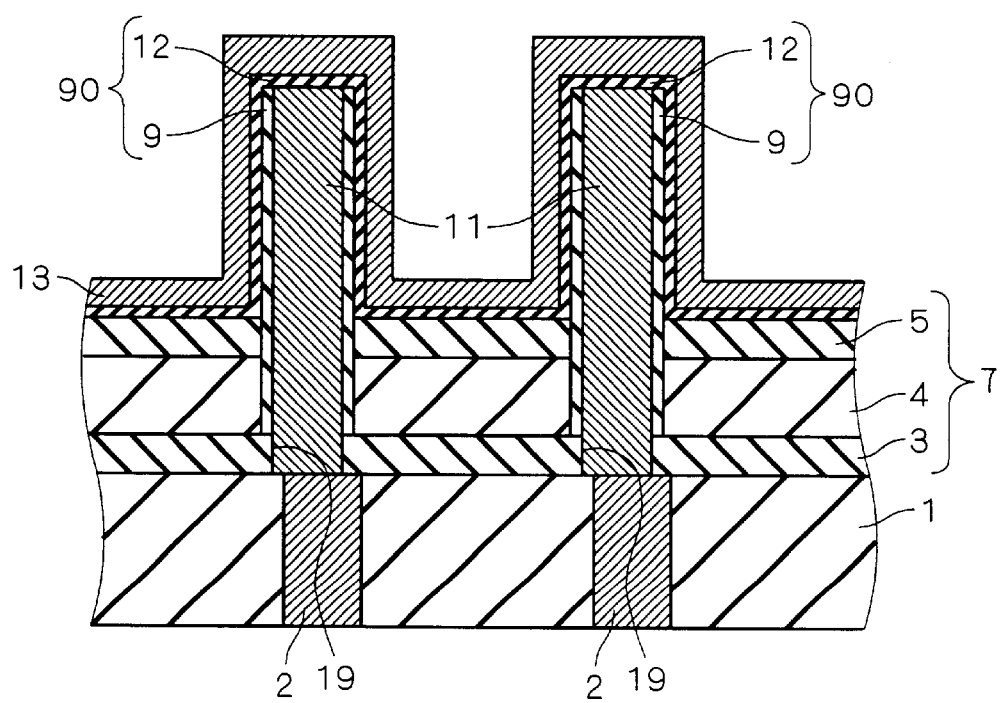

Next, the lower-electrode material 10 of a platinum-group metal, e.g. Ru, is applied by CVD method or plating method to fill the holes 8 and 19 and also formed on the top surface of the insulating film 7. This is followed by the process shown in FIG. 6, thus forming the lower electrodes 11 filling the holes 8 and 19. The steps shown in FIGS. 7 and 8 then follow. The upper electrode 13 is then formed on the dielectric film 12 to complete the capacitors shown in FIG. 14.

As shown above, when the holes 8 at least reach the top surface of the stopper film 5 of the insulating film 7, the sides of the lower electrodes 11 that protrude from the insulating film 7, i.e. the sides of the lower electrodes 11 that are located above the top surface of the stopper film 5, can be covered with the dielectric film 9.

In the capacitor manufacturing method of the first preferred embodiment, the dielectric film 12 is formed after part of the insulating film 7 has been removed. However, the insulating film 7 may be partially removed after the dielectric film 12 has been formed on the top surfaces of the lower electrodes 11. More specifically, with the structure obtained by the process of FIG. 6, the dielectric film 12 is formed on the entire surface and patterned so that the dielectric film 12 remains on the top surfaces of the lower electrodes 11. Then the interlayer insulating film 6, part of the insulating film 7, is removed and then the upper electrode 13 is formed on the entire surface to complete the capacitors. However, as compared with the manufacturing method in which the dielectric film 12 is formed after the removal of the insulating film 7, manufacturing the capacitors in this way additionally requires the step of patterning the dielectric film 12. That is to say, when capacitors are manufactured by the steps shown in FIGS. 7 and 8, the dielectric film 12 is formed not partially but on the entire surface. Accordingly the dielectric film 12 can be formed easier than when it is formed before the insulating film 7 is removed. Therefore, the steps shown in FIGS. 7 and 8, where the dielectric film 12 is formed after the removal of the insulating film 7, are preferred from the viewpoint of the efficiency in capacitor manufacture.

Second Preferred Embodiment

Figure 15:
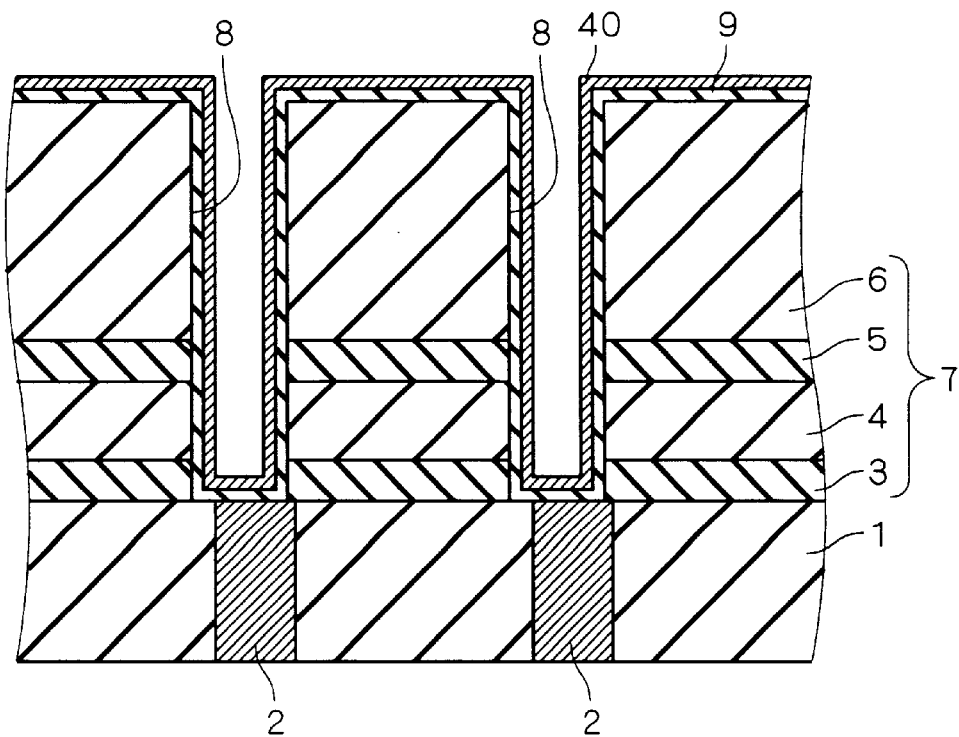
FIGS. 15 to 21 are cross-sectional views sequentially showing a capacitor manufacturing method according to a second preferred embodiment of the present invention.

FIGS. 15 to 21 are cross-sectional views sequentially showing a capacitor manufacturing method according to a second preferred embodiment of the invention, where a platinum-group metal is adopted as the material of the lower electrodes and a metal oxide having a high dielectric constant is adopted as the material of the dielectric film. The capacitor manufacturing method of the second preferred embodiment is now described referring to FIGS. 15 to 21. The step shown in FIG. 15 follows the step shown in FIG. 3 and therefore the steps prior to the step of FIG. 15 are not described here again.

On the top surface of the structure obtained by the step shown in FIG. 3, an electrode material 40 of the electrodes is formed without filing the holes 8. Thus, as shown in FIG. 15, the electrode material 40 is formed on the dielectric film 9, without filling the holes 8. The electrode material 40 is formed of a platinum-group metal, e.g. Ru, by CVD method or plating method.

Figure 16:
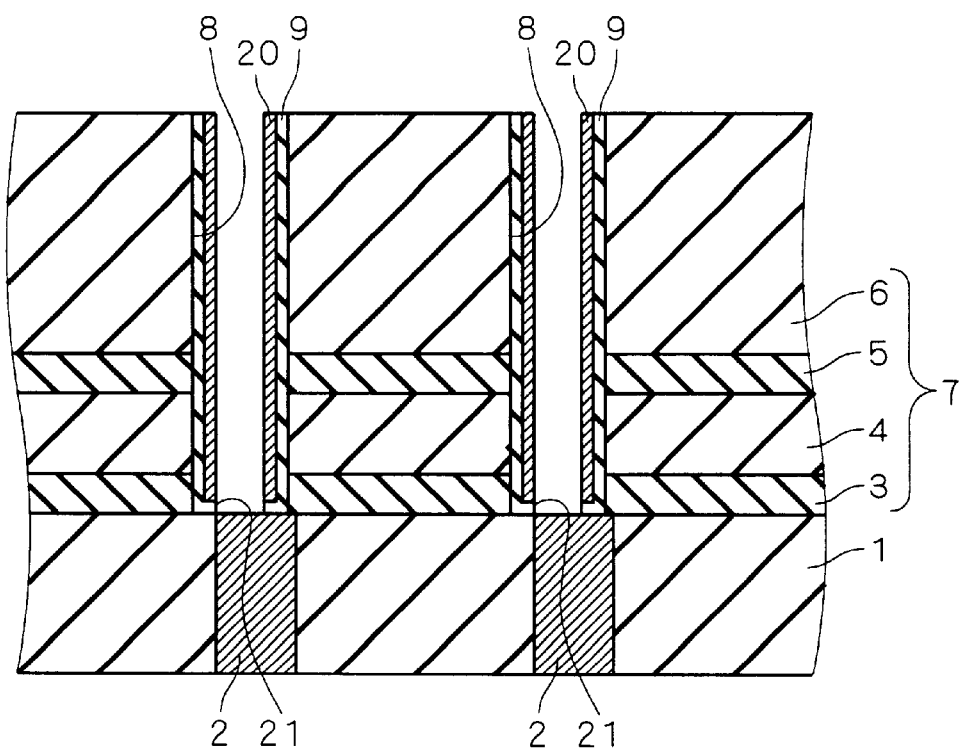

Next, as shown in FIG. 16, an anisotropic dry etching exhibiting a high etching rate in the direction of the thickness of the insulating film 7 is applied to the entire surface of the structure obtained by the process of FIG. 15. Thus the structure obtained by the step of FIG. 15 is etched down from the surfaces of the electrode material 40 formed on the bottoms of the holes 8, so that the dielectric film 9 and the electrode material 40 on the interlayer insulating film 1 and the contact plugs 2 are removed. As a result, holes 21 reaching the contact plugs 2 are formed in the structure obtained by the process of FIG. 15. The structure obtained by the process of FIG. 15 is also etched down from the top surface of the electrode material 40 formed on the top surface of the interlayer insulating film 6 and the part of the dielectric film 9 and the electrode material 40 located above the holes 8, i.e. the part formed on the top surface of the interlayer insulating film 6, is also removed. Thus the metal film 20, part of the lower electrodes, is formed on the sides of the holes 8.

Figure 17:
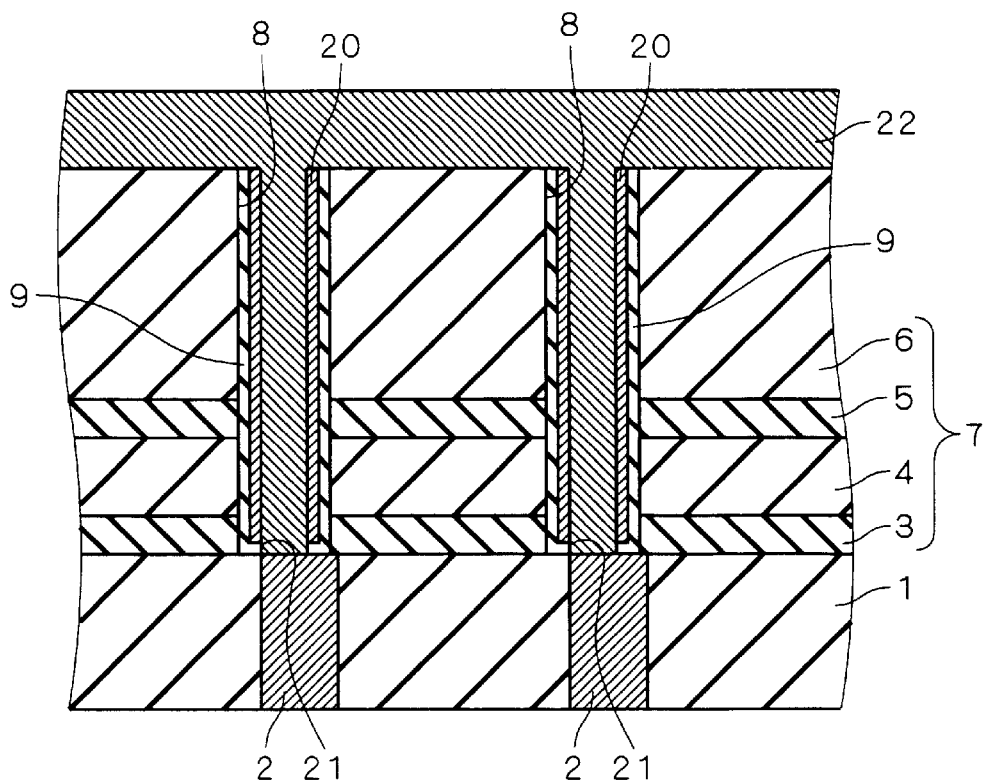
Figure 18:
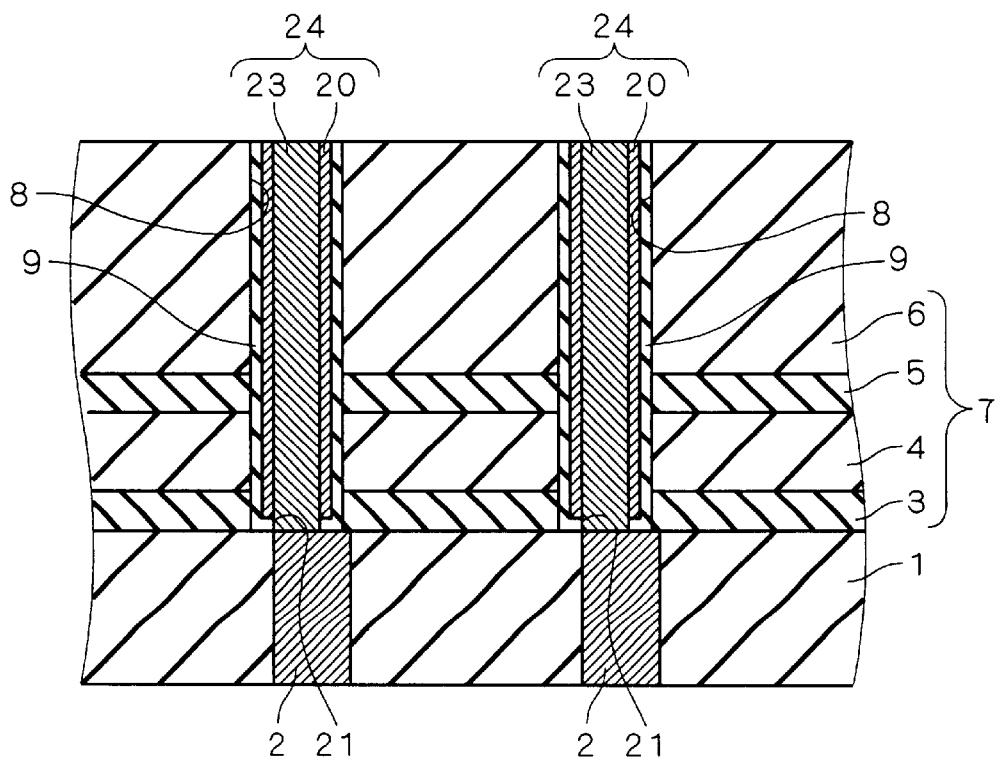

Then, an electrode material 22 of a platinum-group metal, e.g. Ru, is formed by CVD method or plating method to fill the holes 8 and also formed on the top surface of the structure obtained by the process of FIG. 16. In this manner, as shown in FIG. 17, the electrode material 22 of the lower electrodes is formed on the top surface of the insulating film 7 and fills the holes 8. Next, as shown in FIG. 18, the structure obtained by the process of FIG. 17 is polished down from the top surface by, e.g. CMP, so as to remove the electrode material 22 located above the holes 8. Plugs 23 formed of a platinum-group metal and filling the holes 8 and 21 are formed in this manner. As a result, pillar-like lower electrodes 24 are formed, each of which is made of the metal film 20 and the plug 23 filling the holes 8 and 21. The lower electrodes 24 are electrically connected to the contact plugs 2 and are exposed from the insulating film 7 only in the top surfaces.

Figure 19:
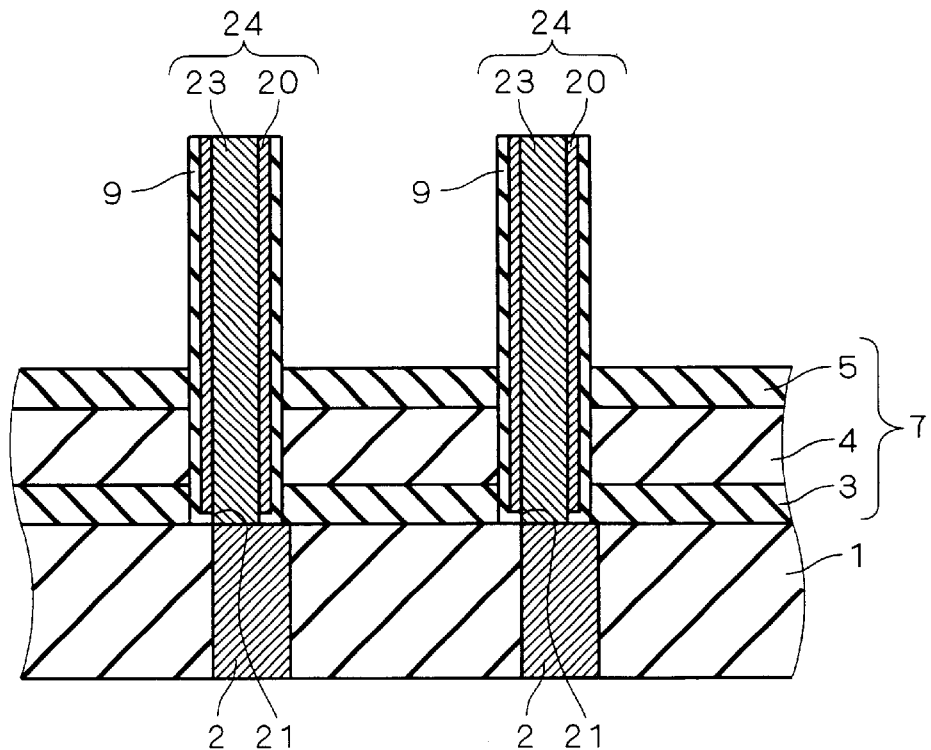

Next, as shown in FIG. 19, a wet or dry etching is applied to the structure obtained by the process of FIG. 18 to selectively remove the insulating film 7, more specifically to remove the interlayer insulating film 6. The stopper film 5 serves as an etching stopper during this process.

Figure 20:
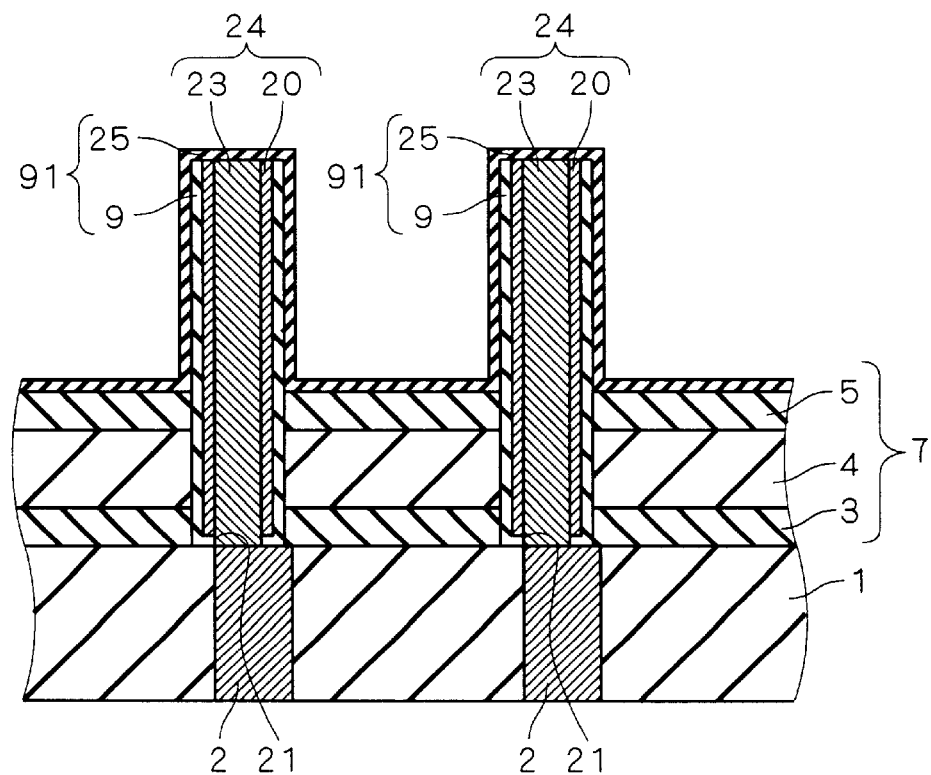

Next, a dielectric film 25 of the same material as the dielectric film 9 is formed by, e.g. PVD method, on the entire surface of the structure obtained by the process of FIG. 19. Thus, as shown in FIG. 20, the dielectric film 25 is formed on the tops of the lower electrodes 11, on the surface of the dielectric film 9, and on the top surface of the stopper film 5; the dielectric film 9 and the dielectric film 25 thus form a capacitor dielectric film 91.

Figure 21:
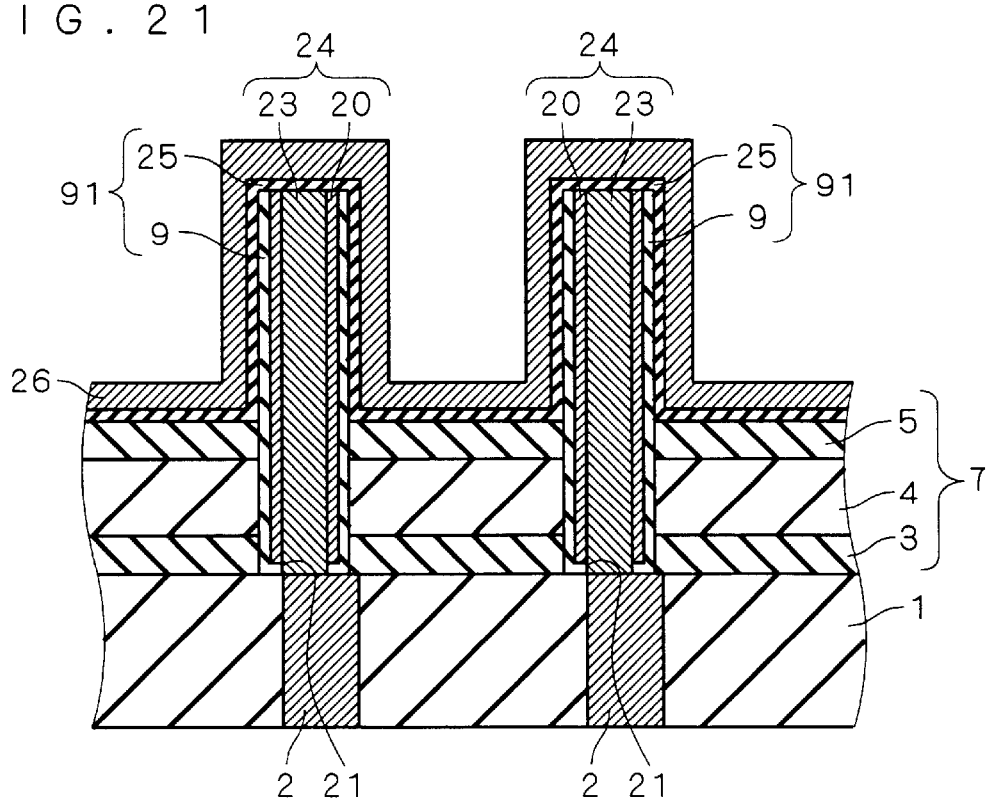

Then, as shown in FIG. 21, an upper electrode 26 of a platinum-group metal, e.g. Ru, is formed on the dielectric film 91 to complete the capacitors.

As shown above, in the capacitor manufacturing method of the second preferred embodiment, in forming the holes 21 in the step of FIG. 16, the structure is etched from above the surface of the metal film 20 or a part of the lower electrodes 24, so that the dielectric film 9 is not damaged by the etching. In the first preferred embodiment, the dielectric film 9 is damaged by the etching for forming the holes 18 reaching the contact plugs 2 because the structure is etched from above the surface of the dielectric film 9. In this case the dielectric film 9 may suffer deterioration of the electric characteristics.

Thus, the capacitor manufacturing method of the second preferred embodiment prevents the dielectric film 9 from being damaged by the etching for forming the holes 21 reaching the contact plugs 2, thus preventing the deterioration of the electric characteristics of the dielectric film 9. This offers capacitors with enhanced electric characteristics as compared with ones made by the capacitor manufacturing method of the first preferred embodiment.

Also, in the formation of the lower electrodes 24 in the capacitor manufacturing method of the second preferred embodiment, the electrode materials 22 and 40 located above the holes 8 are removed as shown in FIGS. 16 and 18. Thus, at first, the lower electrodes 24 are uncovered with the dielectric film 9 only on the top surfaces. Therefore, after the formation of the dielectric film 9, the remaining part of the capacitor dielectric film 91, i.e. the dielectric film 25, can be formed just to sufficiently cover the top surfaces of the lower electrodes 24 as shown in the second preferred embodiment. Accordingly, even when the lower electrodes 24 formed in the holes 8 have a high aspect ratio, the remaining part of the dielectric film can be formed on the lower electrodes 24 by PVD method exhibiting poor step coverage, as shown in the second preferred embodiment. As a result, the dielectric film 25 can be formed without causing the lower electrodes 24 to produce the catalysis.

Figure 22:
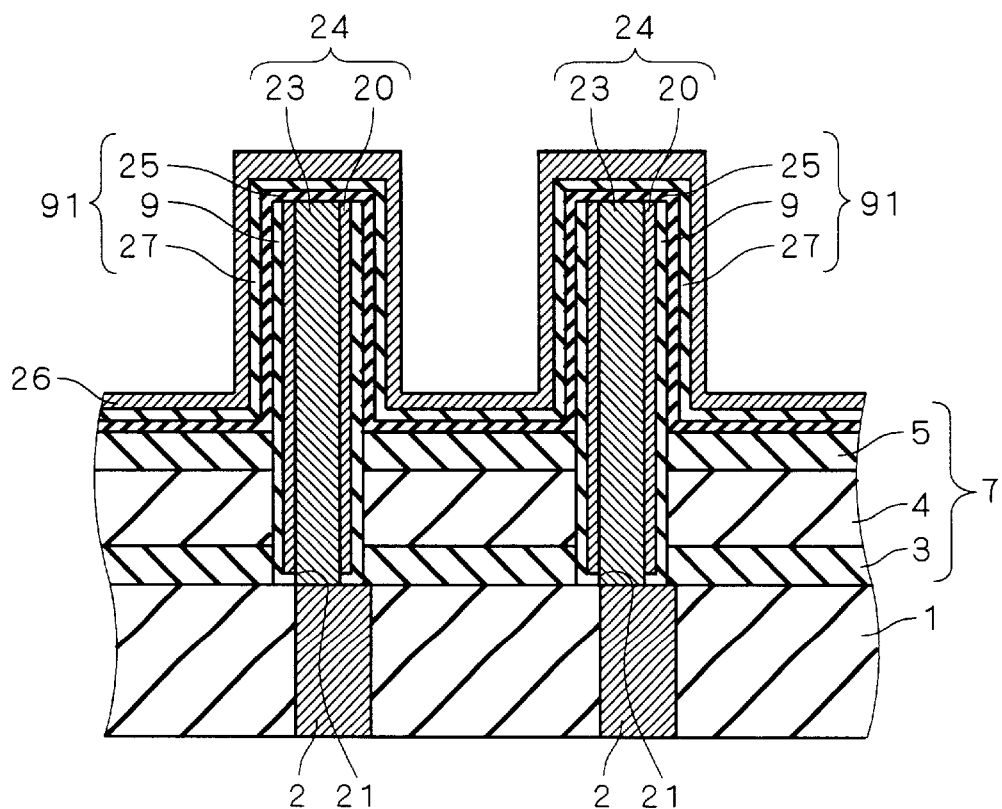
FIG. 22 is a cross-sectional view of a capacitor structure of the second preferred embodiment of the invention.

While the capacitor dielectric film 91 formed by the method of the second preferred embodiment includes the dielectric film 9 and the dielectric film 25, another dielectric film may be formed on the dielectric film 25. FIG. 22 is a cross-sectional view of a capacitor structure in which a dielectric film 27 is further formed on the dielectric film 25. A method for manufacturing the structure of FIG. 22 is now described.

The interlayer insulating film 6, part of the insulating film 7, is removed (see FIG. 19) and then the dielectric film 25 is formed (see FIG. 20), and then the dielectric film 27 is formed by CVD method on the dielectric film 25. The dielectric film 27 is made of the same material as the dielectric films 9 and 25. Then the upper electrode 26 is formed on the dielectric film 27. Thus, the capacitors having a dielectric film 91, including the dielectric films 9, 25 and 27, is completed as shown in FIG. 22.

Also, in the capacitor manufacturing method of the second preferred embodiment, as in the first preferred embodiment, the holes 8 are formed to reach the contact plugs 2 in the step of FIG. 2. However, the holes 8 may be formed to reach at least the top surface of the stopper film 5 in the insulating film 7. As an example, a capacitor manufacturing method is now described in which, in the step of FIG. 2, the holes 8 are formed to reach the top surface of the stopper film 5, and to further reach the top surface of the stopper film 3 past the stopper film 5.

First, the steps shown in FIGS. 11 and 12 are performed. That is to say, the insulating film 7 is etched from the top surface to form the holes 8 reaching the top surface of the stopper film 3 in the insulating film 7, and then the dielectric film 9 is formed by CVD method on the top surface of the interlayer insulating film 6 and on the surfaces of the holes 8, without filling the holes 8.

Figure 23:
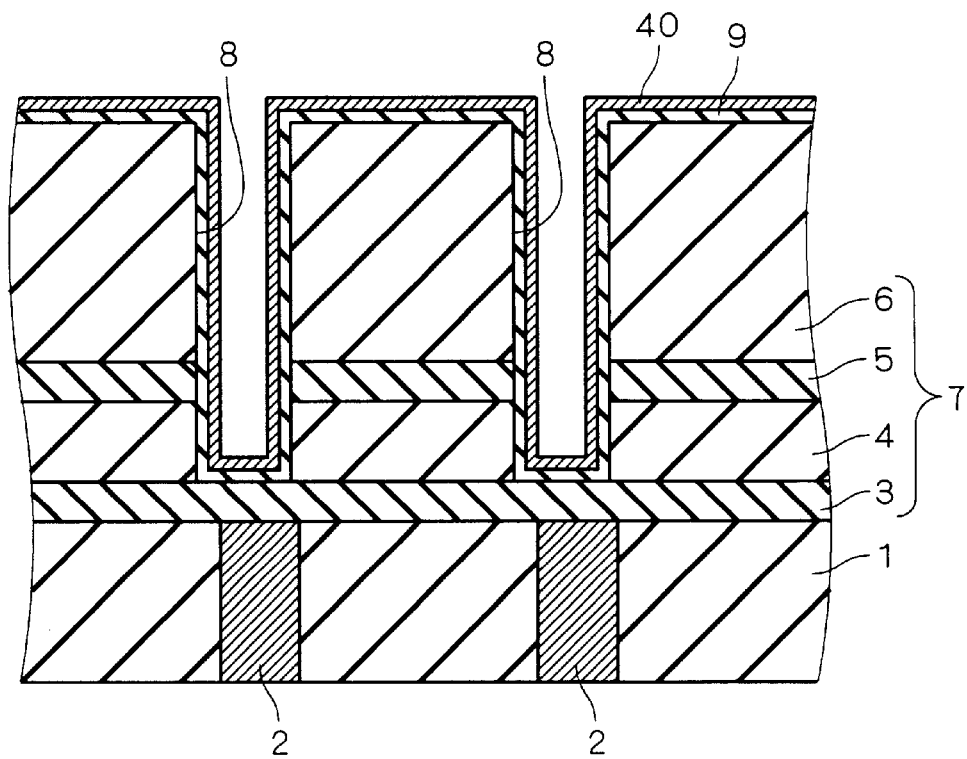
FIGS. 23 to 25 are cross-sectional views sequentially showing a capacitor manufacturing method according to the second preferred embodiment of the invention.
Figure 24:
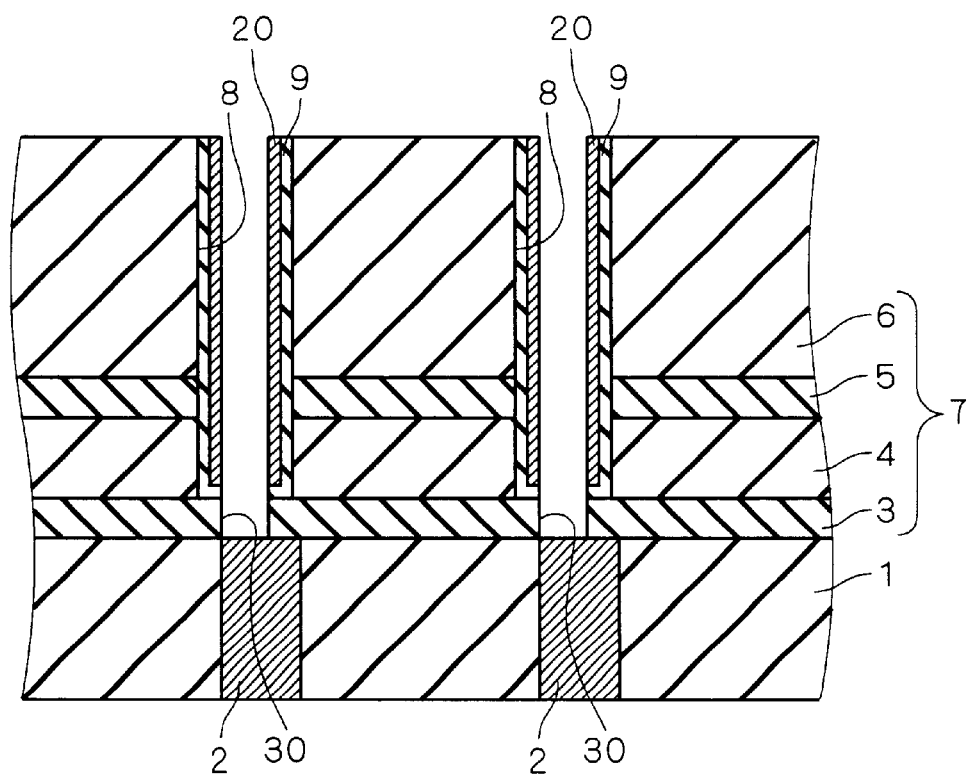

Then, as shown in FIG. 23, the electrode material 40 is formed on the dielectric film 9 without filling the holes 8. Then, as shown in FIG. 24, an anisotropic dry etching exhibiting a high etching rate in the direction of the thickness of the insulating film 7 is applied to the entire surface of the structure obtained by the process of FIG. 23. Thus, the structure obtained by the step of FIG. 23 is etched from the surface of the electrode material 40 formed on the bottoms of the holes 8, and thus the dielectric film 9 and the electrode material 40 on the stopper film 3 and the stopper film 3 itself are removed. As a result the holes 30 reach the contact plugs 2 in the structure obtained by the process of FIG. 23. The structure obtained by the process of FIG. 23 is etched also from the top surface of the electrode material 40 formed on the top surface of the interlayer insulating film 6, and the dielectric film 9 and the electrode material 40 located above the holes 8 are thus removed. The metal film 20, part of the lower electrodes, is thus formed on the sides of the holes 8.

Figure 25:
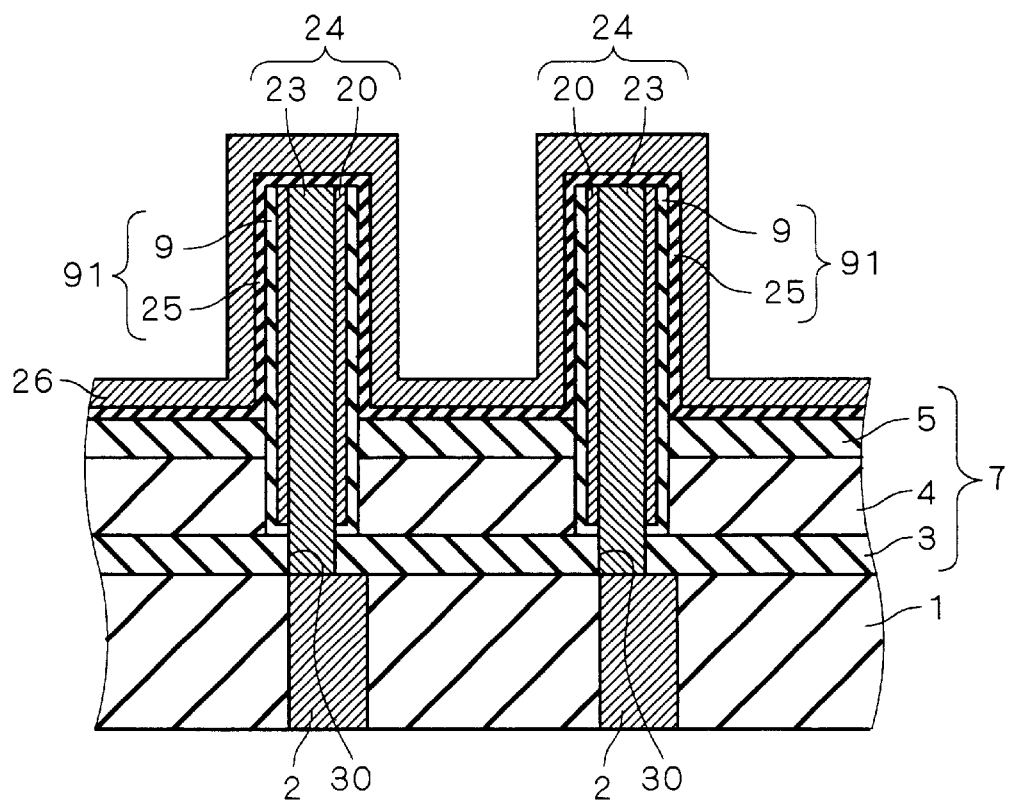
Figure 26:
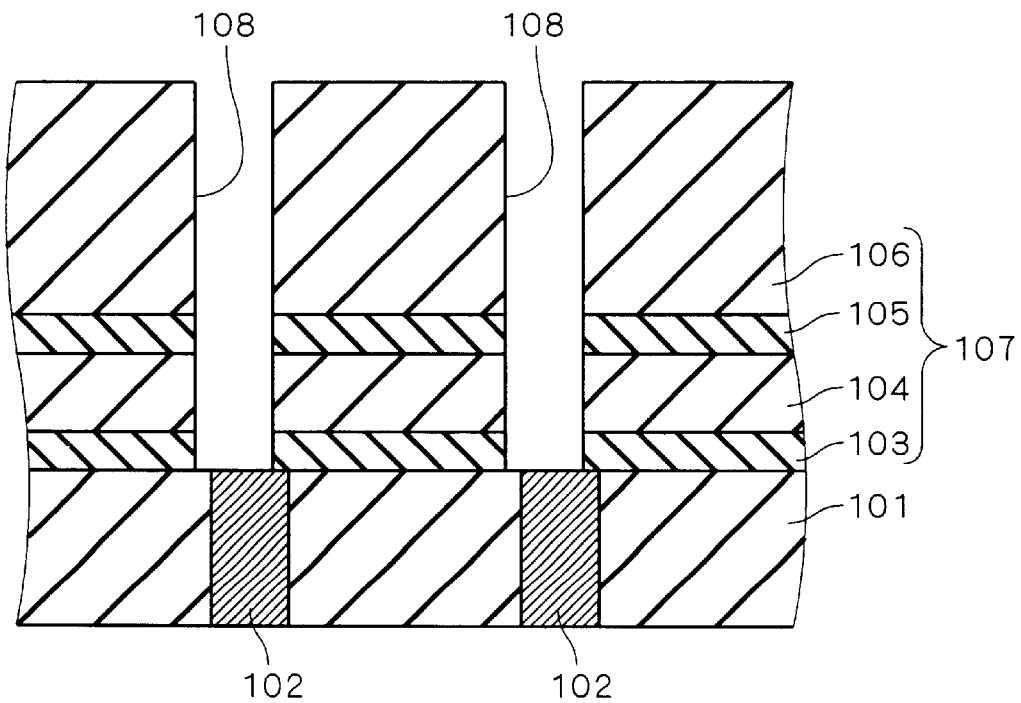
FIGS. 26 to 30 are cross-sectional views sequentially showing a capacitor manufacturing method according to a first conventional technique.
Figure 27:
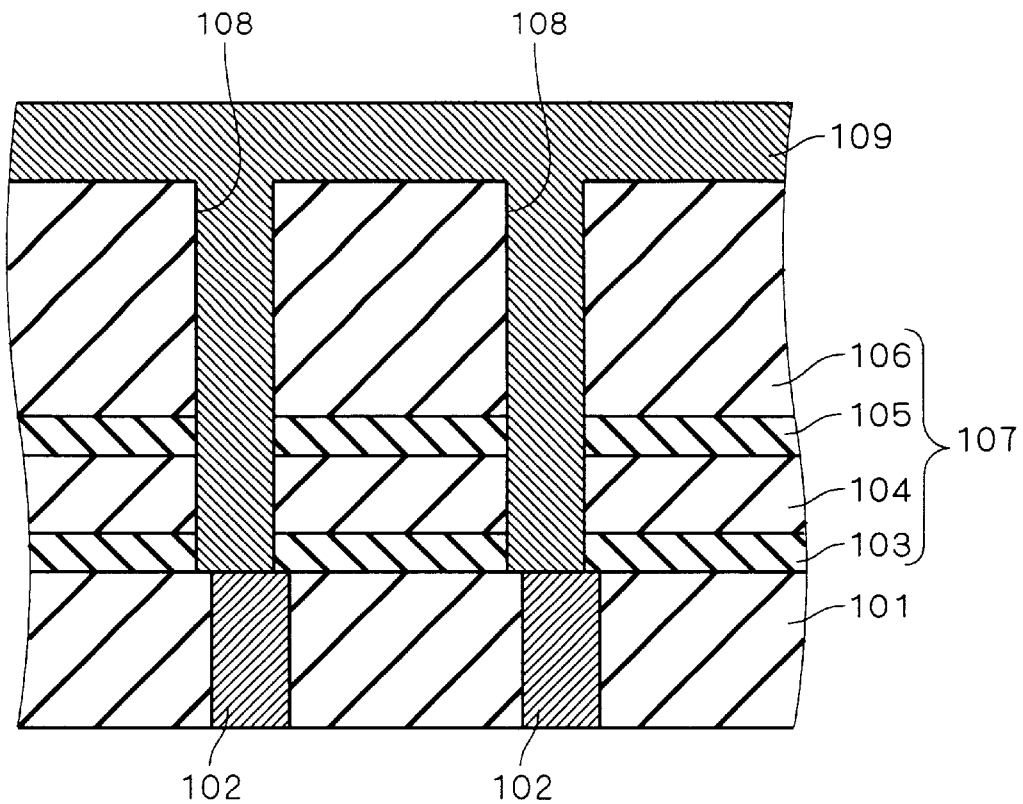
Figure 28:
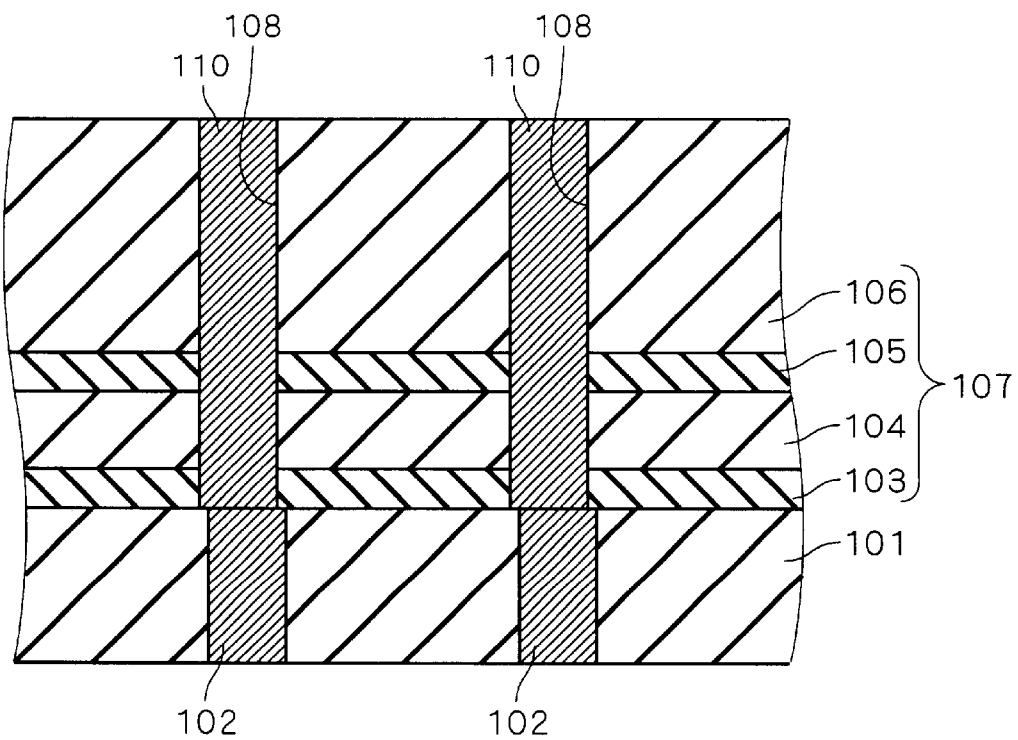
Figure 29:
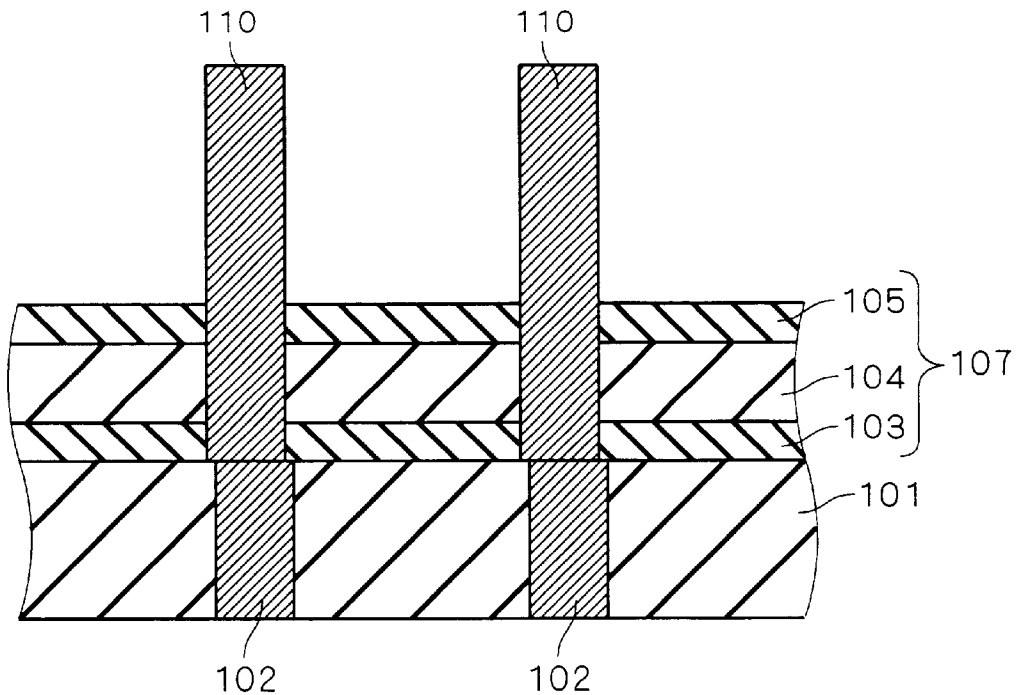
Figure 30:
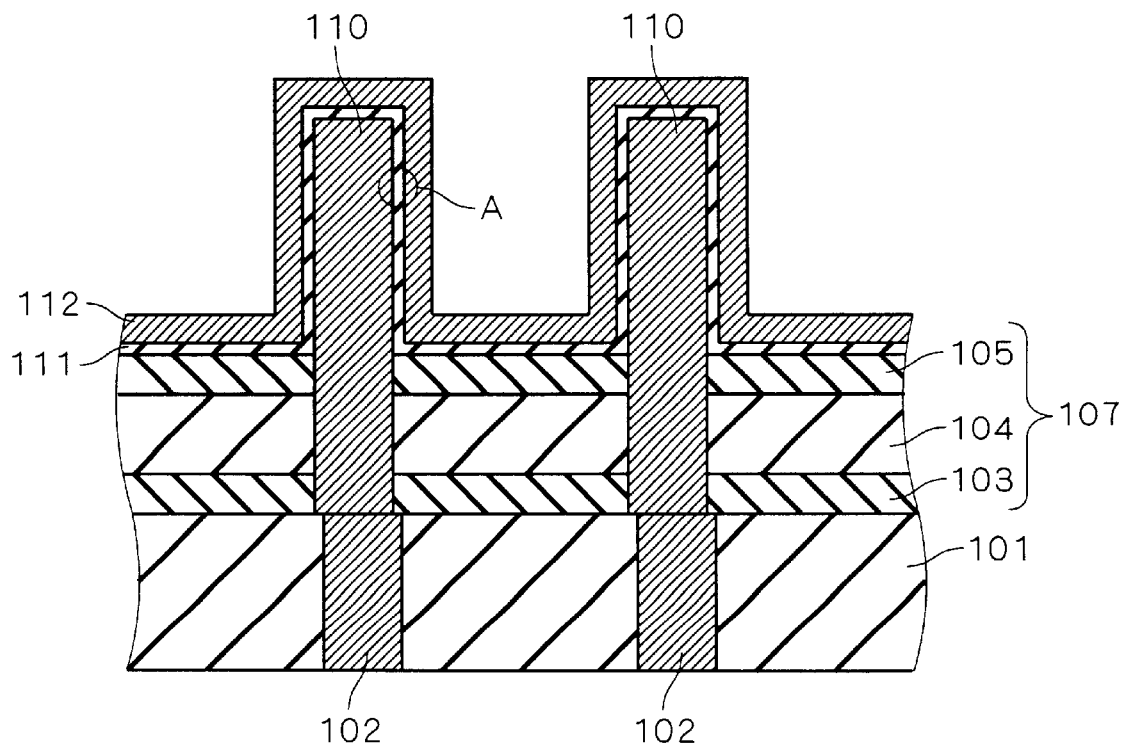
Figure 33:
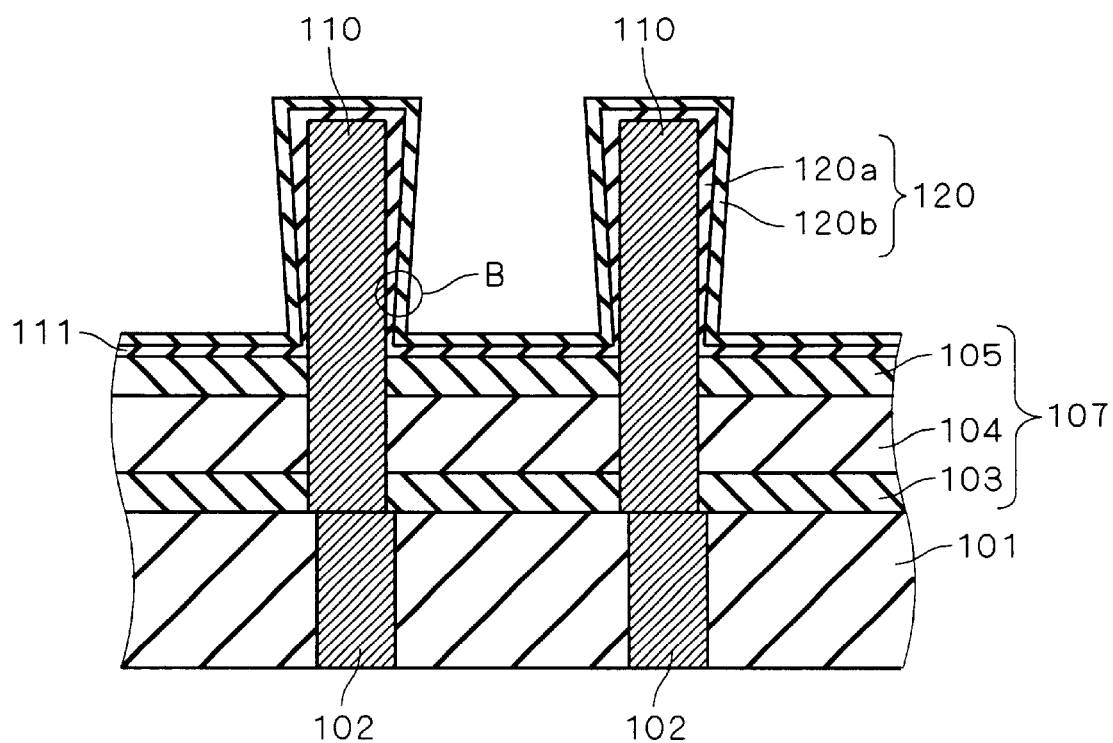
FIG. 33 is a cross-sectional view showing a capacitor structure of a second conventional technique.

Next, the electrode material 22, of a platinum-group metal like Ru, is applied by CVD method or plating method to fill the holes 8 and 30 and also formed on the top surface of the insulating film 7. This is followed by the process shown in FIG. 18, so as to form the lower electrodes 24 filling the holes 8 and 30. The steps shown in FIGS. 19 and 20 then follow. The upper electrode 26 is then formed on the dielectric film 25 to complete the capacitors shown in FIG. 25.

As shown above, as in the capacitor manufacturing method of the first preferred embodiment, as long as the holes 8 at least reach the top surface of the stopper film 5 of the insulating film 7, the sides of the lower electrodes 24 that protrude from the insulating film 7, i.e. the sides of the lower electrodes 24 that are located above the top surface of the stopper film 5, can be covered with the dielectric film 9.

In the capacitor manufacturing method of the second preferred embodiment, the dielectric film 25 is formed after part of the insulating film 7 has been removed. However, as in the first preferred embodiment, the insulating film 7 may be partially removed after the dielectric film 25 has been formed on the tops of the lower electrodes 24. Specifically, with the structure obtained by the step of FIG. 18, the dielectric film 25 is formed on the entire surface and patterned so that the dielectric film 25 remains on the top surfaces of the lower electrodes 24. Then the interlayer insulating film 6, part of the insulating film 7, is removed and then the upper electrode 26 is formed on the entire surface to complete the capacitors. However, as compared with the manufacturing method in which the dielectric film 25 is formed after the removal of the insulating film 7, manufacturing the capacitors in this way additionally requires the step of patterning the dielectric film 25. Therefore, the steps shown in FIGS. 19 and 20, where the dielectric film 25 is formed after the removal of the insulating film 7, are preferred from the viewpoint of the efficiency in capacitor manufacture.

In the capacitor manufacturing method of the second preferred embodiment, the metal film 20, and the plugs 23, or the remaining part of the lower electrodes 24 which is formed after the formation of the metal film 20, are both made of a platinum-group metal. However, the material of the plugs 23, that are not in contact with the dielectric film 9, may be a material other than the platinum-group metals, while the metal film 20 in contact with the dielectric film 9 is made of a platinum-group metal. More specifically, titanium nitride (TiN) may be used as the material of the plugs 23, for example. In this preferred embodiment, the metal film 20 in contact with the dielectric film 9 is made of a platinum-group metal for the reason shown below.

Main electric characteristics of capacitors include the electric capacitance and the leakage current. As for the leakage current, factors that determine the value of the leakage current include the "barrier height" that is formed at the interface between the lower electrode and the dielectric film. The "barrier height" is determined by the correlation between the energy levels at the bottom of the conduction band and the top of the valence band of the dielectric of the dielectric film and the work function of the electrode material. Reducing the capacitor leakage current requires enlarging the "barrier height."

On the other hand, the bandgap is very likely to become smaller as the dielectric constant of the dielectric increases. Accordingly, when a dielectric having a high dielectric constant is used as the material of the dielectric film, it is necessary to use a material having a large work function as the material of the lower electrodes, in order to ensure a desired value of "barrier height"; otherwise an increased number of electrons are injected from the electrode material into the dielectric conduction band, which will increase the leakage current.

Thus, when a high-dielectric-constant dielectric like BST is used as the material of the dielectric film in order to increase the electric capacitance, it is necessary to use a material having a large work function, like platinum-group metals, at least as the material of the lower electrode part that is in contact with the dielectric film, so as to eliminate or alleviate the side effect shown above. Since the second preferred embodiment uses a high-dielectric-constant dielectric as the material of the dielectric film 91, a platinum-group metal is adopted as the material of the metal film 20 in contact with the dielectric film 91, so as to prevent an increase in the leakage current. This maintains the capacitor leakage current at a practically low level.

Also, in the process shown in FIG. 20, the dielectric film 25 is formed in a high-temperature oxidizing atmosphere. The sides of the lower electrodes 24 are covered by the dielectric film 9 at this time, but the oxidation species will pass through the dielectric film 9. Therefore not only the exposed top surfaces of the lower electrodes 24 but also their sides are exposed to the high-temperature oxidizing atmosphere. Accordingly, it is preferable to adopt an oxidation-resistant platinum-group metal as the material of the metal film 20 in contact with the dielectric film 9 so that an adversely affecting oxide having a low dielectric constant will not be formed at the interface between the dielectric film 9 and the lower electrodes 24.

When different materials from each are used as the metal film 20 and the plugs 23 as shown above, a material less expensive than the material of the metal film 20, e.g. titanium nitride (TiN), can be used as the plugs 23. Then the capacitor manufacturing cost can be lower than when the metal film 20 and the plugs 23 are made of the same material. The platinum-group metals generally exhibit reduced resistance to oxidation when they form an alloy with semiconductor or metal other than those of the platinum group. Accordingly, the plugs 23 are preferably made of a material that does not form an alloy with the platinum-group metals, such as a metal nitride, typically titanium nitride.

When the plugs 23 are made not of a platinum-group metal but of titanium nitride, for example, the top surface of the plug 23 is oxidized during the formation of the dielectric film 25 on the top of the lower electrode 24, and then an oxide having a lower relative permittivity than the dielectric film 9, e.g. titanium oxide ($TiO_2$), is formed at the interface between the top surface of the plug 23 and the dielectric film 25. This reduces the capacitor capacitance.

However, the present invention is generally intended to produce its effects in, or to be applied to, capacitors having lower electrodes 24 with a very large aspect ratio.

Accordingly, the top surface of the plug 23 occupies a sufficiently small ratio in the entire surface area of the lower electrode 24, so that the capacitance reduction caused by the low-dielectric-constant oxide falls within the allowable range.

No adversely affecting low-dielectric-constant oxide is formed at the interface between the dielectric film 9 and the lower electrodes 24 because the metal film 20 in contact with the dielectric film 9 is made of a platinum-group metal.

The material of the capacitor lower electrodes 11 and 24 of the first and second preferred embodiments is not limited to a single element of the platinum group; alloys of platinum-group metals may also be used.

While the invention has been described in detail, the foregoing description is in all aspects illustrative and not restrictive. It is understood that numerous other modifications and variations can be devised without departing from the scope of the invention.

What is claimed is:

1. A capacitor manufacturing method, comprising the steps of:
    (a) providing an object to be connected;
    (b) forming an insulating film on said object to be connected;
    (c) forming a first hole in said insulating film;
    (d) forming a first dielectric film on a surface of said first hole, without filling said first hole;
    (e) forming a part of a lower electrode on said first dielectric film, without filling said first hole;
    (f) etching a structure obtained by said step (e) from above a surface of said part of said lower electrode that is formed on the bottom of said first hole, so as to form a second hole reaching said object to be connected in said structure obtained by said step (e);
    (g) forming a remaining part of said lower electrode to fill said first and second holes;
    (h) removing said insulating film after said step (g); and
    (i) after said step (h), forming an upper electrode on said first dielectric film.

2. The capacitor manufacturing method according to claim 1, wherein
    in said step (c), said first hole is formed to open to a top surface of said insulating film,
    in said step (e), an electrode material of said part of said lower electrode is formed on a surface of a structure obtained by said step (d), without filling said first hole, and
    in said step (f), said structure obtained by said step (e) is etched from above a surface of said electrode material of said part of said lower electrode, thereby forming said second hole and also removing said electrode material of said part of said lower electrode that is located above said first hole,
    and wherein said step (g) comprises the steps of:
        (g-1) forming an electrode material of said remaining part of said lower electrode on a surface of a structure obtained by said step (f) while filling said first and second holes; and
        (g-2) after said step (g-1), removing said electrode material of said remaining part of said lower electrode that is located above said first and second holes.

3. The capacitor manufacturing method according to claim 1, further comprising the step (j) of, before said step (i), forming a second dielectric film on the entire surface of a structure obtained by said step (h).

4. The capacitor manufacturing method according to claim 2, further comprising the step (j) of, before said step (i), forming a second dielectric film on the entire surface of a structure obtained by said step (h).

5. The capacitor manufacturing method according to claim 1, wherein said part of said lower electrode formed in said step (e) and said remaining part of said lower electrode formed in said step (g) are made of different materials from each.

6. The capacitor manufacturing method according to claim 2, wherein said part of said lower electrode formed in said step (e) and said remaining part of said lower electrode formed in said step (g) are made of different materials from each.

7. The capacitor manufacturing method according to claim 3, wherein said part of said lower electrode formed in said step (e) and said remaining part of said lower electrode formed in said step (g) are made of different materials from each.

8. The capacitor manufacturing method according to claim 4, wherein said part of said lower electrode formed in said step (e) and said remaining part of said lower electrode formed in said step (g) are made of different materials from each.

9. The capacitor manufacturing method according to claim 1, wherein in said step (d), said first dielectric film is formed by CVD method.

10. The capacitor manufacturing method according to claim 4, wherein in said step (j), said second dielectric film is formed by PVD method.

11. The capacitor manufacturing method according to claim 1, wherein said lower electrode is made of a platinum-group metal and said first dielectric film is made of a metal oxide.

12. The capacitor manufacturing method according to claim 5,
    wherein said part of said lower electrode formed in said step (e) is made of a platinum-group metal,
    said remaining part of said lower electrode formed in said step (g) is made of a metal nitride, and
    said first dielectric film is made of a metal oxide.

13. The capacitor manufacturing method according to claim 11, wherein said metal oxide is BST or tantalum oxide or PZT.

14. The capacitor manufacturing method according to claim 12, wherein said metal oxide is BST or tantalum oxide or PZT.

* * * * *